US006410842B1

(12) United States Patent
McAlonan

(10) Patent No.: US 6,410,842 B1
(45) Date of Patent: Jun. 25, 2002

(54) AUTOMATIC BURNER DRIVEN GENERATOR SYSTEM

(75) Inventor: Stephen T. McAlonan, Austin, TX (US)

(73) Assignee: Teledyne Energy Systems a division of Teledyne Brown Engineering, Inc., Hunt Valley, MD (US)

( * ) Notice: Subject to any disclaimer, the term of this patent is extended or adjusted under 35 U.S.C. 154(b) by 0 days.

(21) Appl. No.: 09/826,879

(22) Filed: Apr. 6, 2001

Related U.S. Application Data

(60) Provisional application No. 60/205,296, filed on May 19, 2000.

(51) Int. Cl.7 .............................................. H01L 35/02
(52) U.S. Cl. ......................................... 136/242; 431/79
(58) Field of Search ................................ 136/242, 217; 431/79

(56) References Cited

U.S. PATENT DOCUMENTS

| | | | |
|---|---|---|---|
| 3,627,588 A | 12/1971 | Rubinstein et al. | 136/205 |
| 3,881,962 A | 5/1975 | Rubinstein | 136/209 |
| 4,131,413 A | 12/1978 | Ryno | 431/44 |
| 4,773,847 A | 9/1988 | Shukla et al. | 431/46 |
| 5,335,730 A | 8/1994 | Cotham, III | 166/374 |
| 5,422,826 A | 6/1995 | Cousineau | 364/494 |
| 5,450,869 A | 9/1995 | Brittain et al. | 136/203 |
| 5,495,829 A | 3/1996 | Jayaraman et al. | 122/110 |
| 5,599,181 A | 2/1997 | Aoki et al. | 431/80 |
| 5,604,758 A | 2/1997 | AuYeung et al. | 372/34 |
| 5,705,770 A | 1/1998 | Ogasawara et al. | 136/205 |
| 5,753,383 A | 5/1998 | Cargnelli et al. | 429/13 |
| 5,917,144 A | 6/1999 | Miyake et al. | 136/205 |
| 6,019,098 A | 2/2000 | Bass et al. | 126/344 |
| 6,335,572 B1 * | 1/2002 | Uno et al. | 290/1 A |

OTHER PUBLICATIONS

Telan/Decap Thermoelectric Generators Engineering and Applications Manual, Teledyne Brown Engineering, Mar. 1996.

* cited by examiner

Primary Examiner—Bruce F. Bell
Assistant Examiner—Thomas H. Parsons
(74) Attorney, Agent, or Firm—Rosenberg, Klein & Lee

(57) ABSTRACT

There is provided an automatic burner driven generator system for powering a load. The Generator system generally comprises a burner unit for generating a thermal energy; a thermoelectric converter unit operatively coupled to the burner unit for transducing at least a portion of the thermal energy to a first electric power signal; a rechargeable battery unit operable to generate an output power signal for powering the load; a charging unit operably coupled to the thermoelectric converter and rechargeable battery units; and, a controller for automatically controlling the actuation of the units in programmed manner. The charging unit is operable to adaptively convert the first electric power signal to a second electric power signal for charging the rechargeable battery unit. The controller includes a microprocessor unit programmable configured to selectively actuate the units in accordance with a plurality of predetermined operational states.

28 Claims, 25 Drawing Sheets

| QUANTITY/DASH NO. | ITEM NO | PART CODE | PART OR IDENTIFYING NO. | EFF SYM | NOMENCLATURE OR DESCRIPTION | STOCK SIZE | MATERIAL OR VENDOR | MATERIAL SPECIFICATION | REV |
|---|---|---|---|---|---|---|---|---|---|
| AR | 71 | | -1045 | | PROTECTIVE PLUG, FOR 1/4" FEMALE NPT | | CAPLUG NO. T-4 OR EQUIV. | | |
| AR | 70 | | -1044 | | PROTECTIVE CAP, FOR 1/4" MALE NPT | | CAPLUG NO. T-6 OR EQUIV. | | |
| | 69 | | NOT USED | | | | | | |
| | 68 | | NOT USED | | | | | | |
| | 67 | | NOT USED | | | | | | |
| | 66 | | NOT USED | | | | | | |
| 1 | 65 | | PT051-001 | | LABEL, INSTALLATION INSTRUCTIONS | | | | |
| 2 | 64 | | PT050-001 | | LABEL, CAUTION- HOT SURFACES | | | | |
| 1 | 63 | | -1040 | | LABEL, AMC | | | | |
| 1 | 62 | | PT049-001 | | LABEL, IDENTIFICATION | | | | |
| 1 | 61 | | AM033-001 | | LABEL, FACTORY MUTUAL APPROVED | | | | |
| 2 | 60 | | -1039 | | DISCONNECT TERMINAL, 22-16 AWG, 1/4" V TAB | | HOFFMAN PROD. P/N FNDDF2216T-250A OR EQUIV. | | |
| | 59 | | NOT USED | | | | | | |
| 2 | 58 | | -1038 | | SCREW, PAN HD, PHILLIPS, #6-32 X 1-1/4" LG, 18-8 SS | | | | |
| 4 | 57 | | -1037 | | SCREW, PAN HD, PHILLIPS, #6-32 X 1" LG, 18-8 SS | | | | |
| | 56 | | NOT USED | | | | | | |
| REF | 55 | | AM051 | | WIRING DIAGRAM, TEG TELAN 6T | | | | |
| | 54 | | NOT USED | | | | | | |
| | 53 | | NOT USED | | | | | | |
| 1 | 52 | | -1033 | | PRESSURE REGULATOR | | CONTROLAIR P/N TYPE 400-MODIFIED OR EQUIV. | | |
| 2 | 51 | | -1032 | | NUT, HEX, SERRATED FLANGE, #1/4-28, ZINC PLT STL | | | | |
| 1 | 50 | | -1031 | | LOCK WASHER, INTERNAL TOOTH, ZINC PLT STL, FOR A 7/16" STUD | | | | |
| AR | 49 | | -1030 | | SOLDER, 63%Sn/37%Pb WIRE ∅ .028 RESIN CORE | | | | |
| AR | 48 | | -1029 | | WIRE, RED TFE TEFLON INSUL., 18 AWG STRD, 19/30 | | SILVER PLATED COPPER | MIL-W-16878 | |
| AR | 47 | | -1028 | | WIRE, BLACK TFE TEFLON INSUL., 18 AWG STRD, 19/30 | | SILVER PLATED COPPER | MIL-W-16878 | |
| | 46 | | NOT USED | | | | | | |
| AR | 45 | | -1026 | | THREAD-LOCKER ADHESIVE | | LOCTITE CORP. P/N 222 OR EQUIV. | | |
| AR | 44 | | -1025 | | THERMAL GREASE | | DOW CORNING P/N 340 OR EQUIV. | | |
| AR | 43 | | -1024 | | PTFE JOINT SEALANT (FLUORAMICS, INC- FORMULA-8) | | McMASTER-CARR P/N 4538K1 OR EQUIV. | | |
| | 42 | | NOT USED | | | | | | |
| | 41 | | NOT USED | | | | | | |
| 4 | 40 | | -1021 | | SCREW, CAP HEX HD, 1/4-20 X 3-3/4" LG, 18-8 SS | | | | |
| 2 | 39 | | -1020 | | WASHER, FLAT, SS, 5/8" OD, FOR A 1/4" SCREW | | | | |
| | 38 | | NOT USED | | | | | | |
| 2 | 37 | | -1018 | | SCREW, CAP HEX HD, 1/4-28 X 5" LG, ZINC PLT STL | | | | |
| 8 | 36 | | -1017 | | SCREW, CAP HEX HD, 1/4-20 X 1/2" LG, ZINC PLT STL | | | | |
| 1 | 35 | | -1016 | | SCREW, HEX HD, SELF-TAPPING, #10-32 X 3/8" LG, COLOR CODED GREEN, NAED NO. 783786-11104 | | | | |
| 3 | 34 | | -1015 | | SCREW, SLOTTED HEX HD, TYPE F SELF-TAPPING, #8-32 X 3/4" LG, ZINC PLT STL | | | | |
| 4 | 33 | | -1014 | | SCREW, SLOTTED HEX HD, TYPE F SELF-TAPPING, #8-32 X 3/8" LG, ZINC PLT STL | | | | |
| 2 | 32 | | -1013 | | SPACER, AL ALY, .25 OD X .14 ID X 1.00 LG | | McMASTER-CARR P/N 92510A310-6 OR EQUIV. | | |
| 4 | 31 | | -1012 | | SPACER, AL ALY, .25 OD X .14 ID X .62 LG | | McMASTER-CARR P/N 92510A307-6 OR EQUIV. | | |
| 3 | 30 | | -1011 | | SPACER, AL ALY, .31 OD X .17 ID X .25 LG | | McMASTER-CARR P/N 92510A315-8 OR EQUIV. | | |
| 1 | 29 | | -1010 | | O-RING, SILICONE, 7/16" ID X 9/16" OD | | PARKER P/N 2-013-S604-70 OR EQUIV. | | |
| 1 | 28 | | -1009 | | BULKHEAD ADAPTER, BRASS, 1/4" M-NPT TO 1/4" TUBE | | HOKE GYROLOK P/N 4BCM4-BR | | |
| 1 | 27 | | -1008 | | MALE ADAPTER, 1/8" NPT TO 1/4" TUBE, BRASS | | HOKE GYROLOK P/N 4AM2-BR OR EQUIV. | | |
| 1 | 26 | | -1007 | | MALE CONN, BRASS, 1/4" TUBE TO 1/8" NPT-M | | IMPERIAL EASTMAN P/N 68-F-04X02 OR EQUIV. | | |
| | 25 | | NOT USED | | | | | | |
| 3 | 24 | | -1005 | | CABLE TIE, SCREW MOUNTABLE, 6/6 NYLON | | HEYCO P/N 3555 OR EQUIV. | | |
| 1 | 23 | | -1004 | | CONDUIT HUB, ELEC, 1/2" NPT | | O-Z GEDNEY P/N CHM-50 OR EQUIV. | | |
| AR | 22 | | -1003 | | INSULATION, FIBERFRAX BULK FIBER | | UNIFRAX P/N 720402000 OR EQUIV. | | |
| 1 | 21 | | -1002 | | FUEL FILTER | | EAGLE COMFORT SYS P/N TYPE408-A2F2M OR EQUIV. | | |
| AR | 20 | | -1001 | | SILICONE SEALANT | | DOW CORNING P/N RTV-732-CLEAR OR EQUIV. | | |
| 1 | 19 | SV1 | 2V131-1NB-A3A5 | | SOLENOID VALVE | | SNAP-TITE, INC | | |
| 1 | 18 | B1 | A412/8.5 | | BATTERY, GELLED ELECTROLYTE, 12 VOLT, 8.5 Ah | | EXIDE CORP/SONNENSCHEIN | | |
| 1 | 17 | A1 | AM050-009 | | SYSTEM CONTROLLER/BATTERY CHARGER | | | | |
| 1 | 16 | A2 | AM300-009 | | T/E MODULE ASSY | | | | |
| 4 | 15 | | 2S19025 | | SPRING, COMPRESSION | | MID-WEST SPRING | | |
| 4 | 14 | | MS15795-811 | | WASHER, SS, 3/4" OD, FOR A 1/4" SCREW | | | | |
| 4 | 13 | | PT025-001 | | SPACER, BURNER BOX ASSY | | | | |
| | 12 | | NOT USED | | | | | | |
| 1 | 11 | | AM020-001 | | FUEL LINE | | | | |
| 1 | 10 | | PT019-001 | | SUPPORT ANGLE, BATTERY | | | | |
| 2 | 9 | | PT018-001 | | SUPPORT BRACKET, TEG | | | | |
| 1 | 8 | | PT017-001 | | VENT SCREEN | | | | |
| | 7 | | NOT USED | | | | | | |
| 1 | 6 | | PT009-001 | | SHELF, RETAINING | | | | |
| 1 | 5 | | PT005-001 | | EXHAUST CAP | | | | |
| 1 | 4 | | PT032-009 | | THERMAL BARRIER ASSY | | | | |
| | 3 | | NOT USED | | | | | | |
| 1 | 2 | | PT030-009 | | BURNER BOX/VENTURI ASSY | | | | |
| 1 | 1 | | PT001-009 | | ENCLOSURE ASSY | | | | |
| X | | | -009 | | T/E GENERATOR- TELAN 6T PROTOTYPE | | | | |

ODD DASH NO. SHOWN    EVEN DASH NO. OPP    LIST OF MATERIAL

FIGURE 1B

| ITM | QTY | UM | REF DESIGNATION | DESCRIPTION |
|---|---|---|---|---|
| 1 | 1 | EA | | Printed Circuit Board |
| 2 | REF | | | Electrical Schematic |
| 3 | 11 | EA | R1,R5,R8,R9,R22,R27,R28,R31,R36,R38,R45 | Resistor, 1/8W 1206 5% 4.7K |
| 4 | 1 | EA | R6 | Resistor, 1/8W 1206 1% 13K |
| 5 | 6 | EA | R3,R4,R7,R34,R44,R46 | Resistor, 1/8W 1206 1% 10K |
| 6 | 1 | EA | R26 | Resistor, 1/8W 1206 5% 10K |
| 7 | 1 | EA | R21 | Resistor, 1/8W 1206 1% 100K |
| 8 | 2 | EA | R25,R37 | Resistor, 1/8W 1206 5% 1K |
| 9 | 1 | EA | R33 | Resistor, 1/8W 1206 1% 24.3K |
| 10 | 2 | EA | R43,R48 | Resistor, 1/8W 1206 1% 5.11K |
| 11 | 2 | EA | R24,R29 | Resistor, 1/8W 1210 5% 220 |
| 12 | 1 | EA | R40 | Resistor, 1/8W 1% 1206 9.31K |
| 13 | 1 | EA | R39 | Resistor, 1/8W 1% 1206 28K |
| 14 | 1 | EA | R23 | Resistor, 1/8W 1% 1206 3.32K |
| 15 | 2 | EA | R30,R41 | Resistor, 1/8W 1206 1% 4.99K |
| 16 | 4 | EA | R2,R10,R17,R42 | Resistor, 1/8W 1206 1% 499K |
| 17 | 1 | EA | R12 | Current Shunt, 1206 5% 0.025 |
| 18 | 3 | EA | R14,R15,R19 | Resistor, 1/8W 1206 1% 301K |
| 19 | 3 | EA | R13,R32,R35 | Resistor, 1/8W 1206 5% 1M |
| 20 | 1 | EA | R20 | Resistor, 1/8W 1206 1% 40.2K |
| 21 | 1 | EA | R18 | Resistor, 1/8W 1206 1% 5.23K |
| 22 | 1 | EA | R16 | Resistor, 1/8W 1206 1% 45.3K |
| 23 | 1 | EA | R11 | Current shunt, 1206 5% 0.05 |
| 24 | 15 | EA | C1 - C3, C5 - C9, C15 - C18, C22,C26,C27 | Capacitor, 1206 0.1uF +80-20 |
| 25 | 4 | EA | C4,C23,C24,C25 | Capacitor, 1206 0.1uF X7R |
| 26 | 1 | EA | C14 | Capacitor, 0805 100pF |
| 27 | 1 | EA | C13 | Capacitor, 0805 1000pF |
| 28 | 7 | EA | C1,C10,C11,C12,C19,C20,C21 | Capacitor 100uF Alum Elect, low ESR |
| 29 | 2 | EA | D10,D11 | Diode, Schottky MBRS130LT3 |
| 30 | 1 | EA | D5 | Diode, MBRD835L |
| 31 | 1 | EA | D6 | Diode, MMBD4148 |
| 32 | 2 | EA | D9, D12 | Diode, 1N4004 (SMB) |
| 33 | 1 | EA | D8 | Diode, 3V Zener 350mw |
| 34 | 2 | EA | D2, D4 | LED, green Rt angle |
| 35 | 1 | EA | D3 | LED, red Rt angle |
| 36 | 1 | EA | D1 | LED, yellow Rt angle |
| 37 | 1 | EA | D7 | Varistor, 15V SMT |
| 38 | 1 | EA | Q4 | Transistor, FZT955 |
| 39 | 2 | EA | Q3,Q5 | Transistor, MMBT2222A |
| 40 | 1 | EA | Q6 | Transistor, 2N6388 TO220 |
| 41 | 1 | EA | Q1 | Mosfet, SI9804DY |
| 42 | 1 | EA | Q2 | Mosfet, ZVN4306G |
| 43 | 1 | EA | U1 | IC, DS1233DZ-10 |

FIGURE 2A

| ITM | QTY | UM | REF DESIGNATION | DESCRIPTION |
|---|---|---|---|---|
| 44 | 1 | EA | U2 | IC, LM50BIM3 |
| 45 | 1 | EA | U3 | LM4041DIM3-ADJ |
| 46 | 1 | EA | U4 | LMC6464BIM |
| 47 | 1 | EA | U5 | PIC16C74A-04I/P |
| 48 | 1 | EA | U5 | Socket for U5, DIP40 |
| 49 | 1 | EA | U6 | MAX1771ESA |
| 50 | 1 | EA | U7 | LTC1329IS8-50 |
| 51 | 1 | EA | U8 | LT1107IS8 |
| 52 | 1 | EA | U9 | LTC1383IS |
| 53 | 1 | EA | U10 | PS2701-1 |
| 54 | 1 | EA | OS1 | Resonator, w/caps 4mHz SMT |
| 55 | 1 | EA | L2 | Inductor, SMT 100uH |
| 56 | 1 | EA | L1 | Inductor, SMT 22uH |
| 57 | 2 | EA | L3,L4 | Ferrite Bead, 2.5 turn SMT |
| 58 | 1 | EA | J1 | Terminal block, 14 pole header |
| 59 | 1 | EA | P1 | Terminal block, 14 pole plug |
| 60 | 1 | EA | J3 | Jack, rt angle 2 cond. |
| 61 | 1 | EA | P3 | Plug, 2 cond |
| 62 | 2 | EA | JP1,JP2 | Header, 0.1 x 1x3 |
| 63 | 2 | EA | JP1,JP2 | Jumper, shunt |
| 64 | 1 | EA | J4/P4 | Terminal block, 4 pole header/plug |
| 65 | 1 | EA | S1 | Switch, Rt angle DPDT |
| 66 | 1 | EA | F1 | Fuse, resettable, PTC |
| 67 | 1 | EA | K1 | Relay,12V SPDT sealed |
| 68 | 1 | EA | J2 | Connector, RJ11 Rt angle |
| 69 | 1 | EA |  | Heatsink |
| 70 | 2 | EA |  | Screw, 6-32 X .50" lg php |
| 71 | 2 | EA |  | Nut, hex 6-32 |
| 72 | 2 | EA |  | Spacer, nylon #6 X .06" thick |
| 73 | 2 | EA |  | Washer, lock, #6 |
| 74 | AR |  |  | Polyurethane conformal coating |
| 75 | 1 | EA |  | Label, S1 |
| 76 | 1 | EA |  | Label, J4 |
| 77 | 1 | EA |  | Label, P4 |

FIGURE 2B

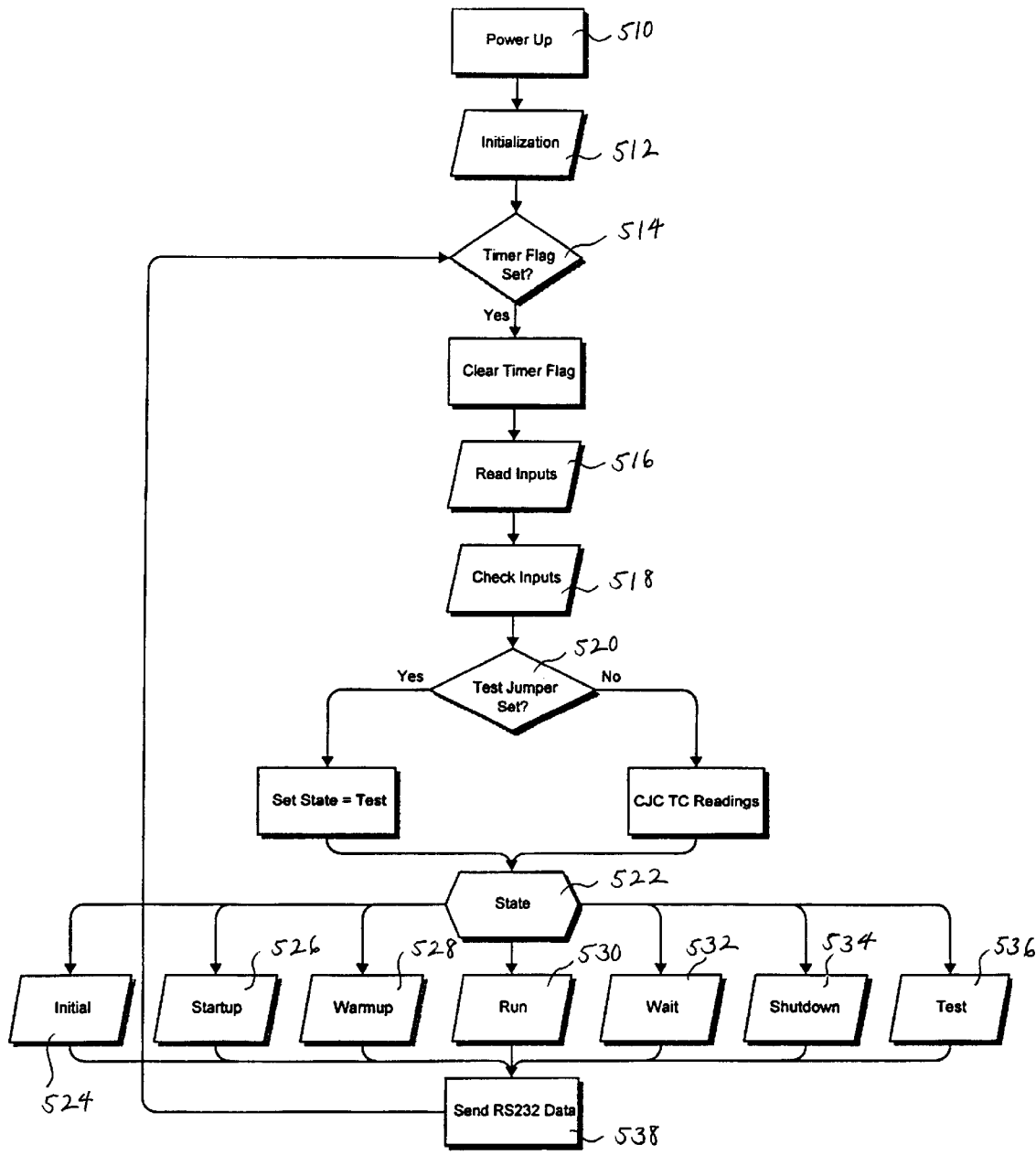
FIGURE 6 SOFTWARE FLOW CHART

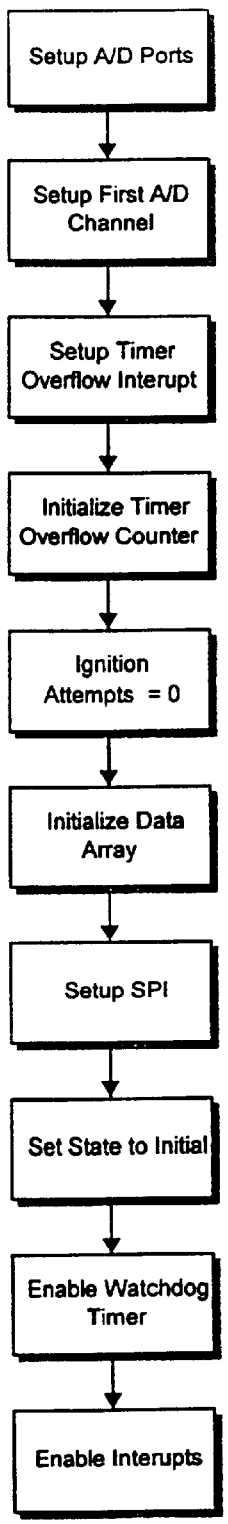
FIGURE 7 INITIALIZATION

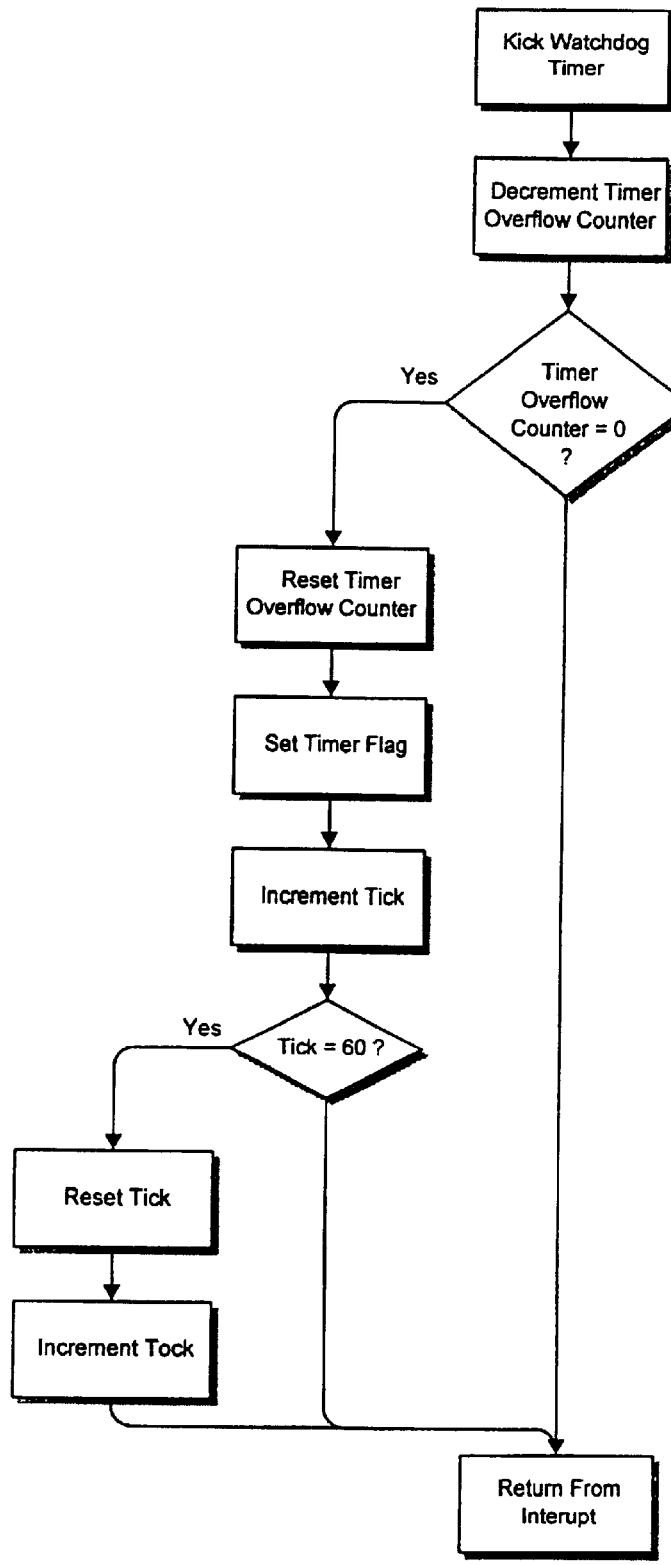
FIGURE 8   TIMER OVERFLOW INTERUPT

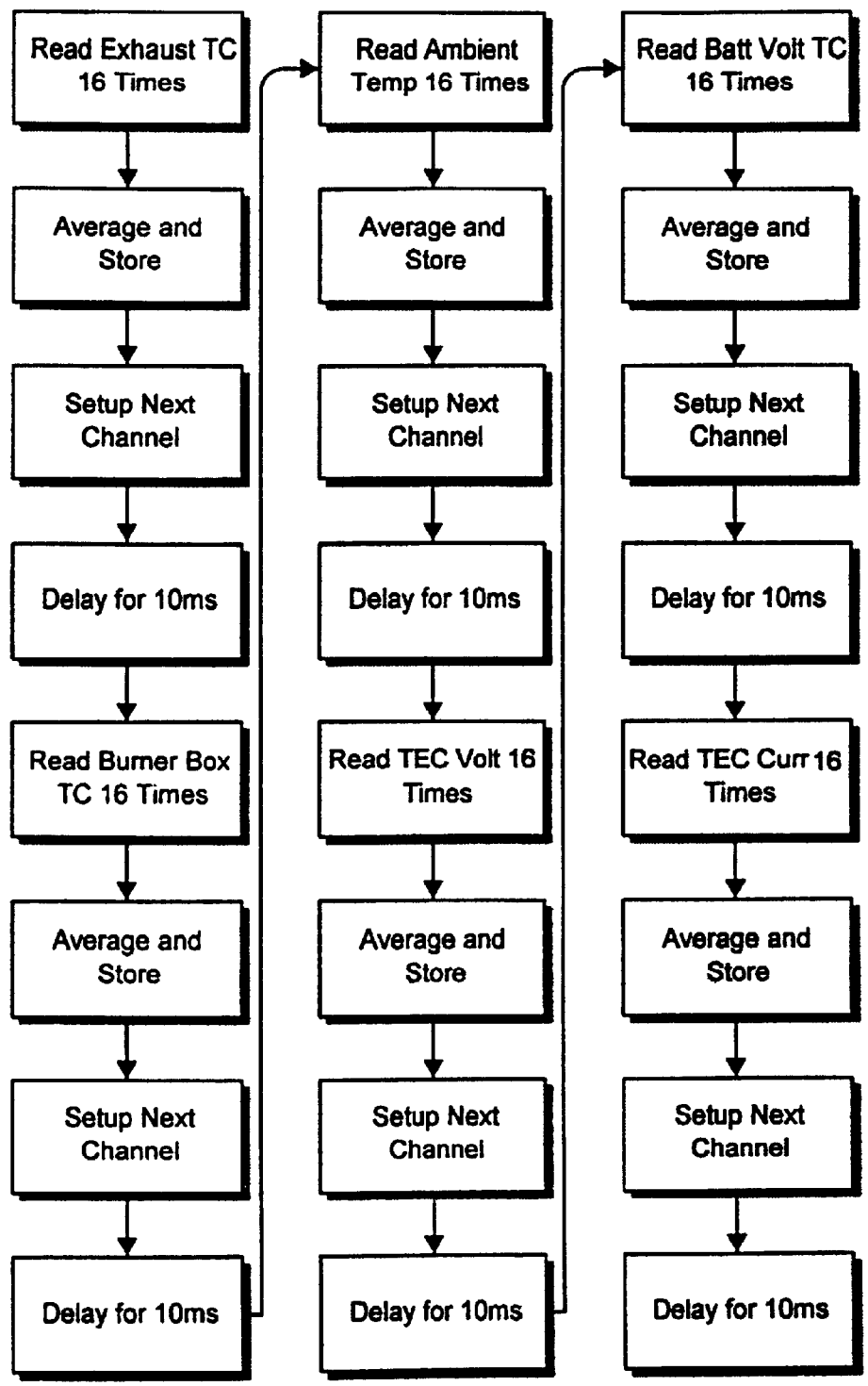
FIGURE 9  READ INPUTS

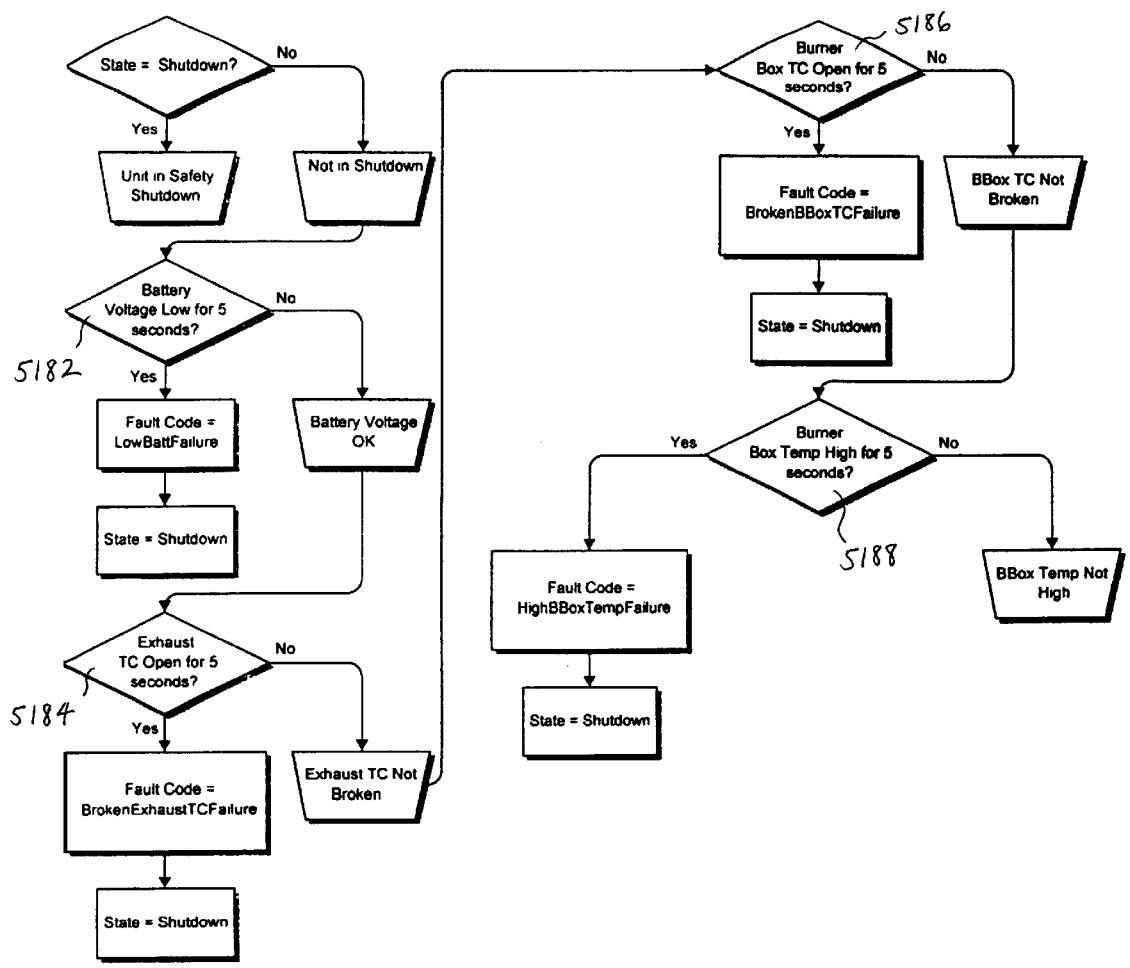
FIGURE 10 CHECK INPUTS

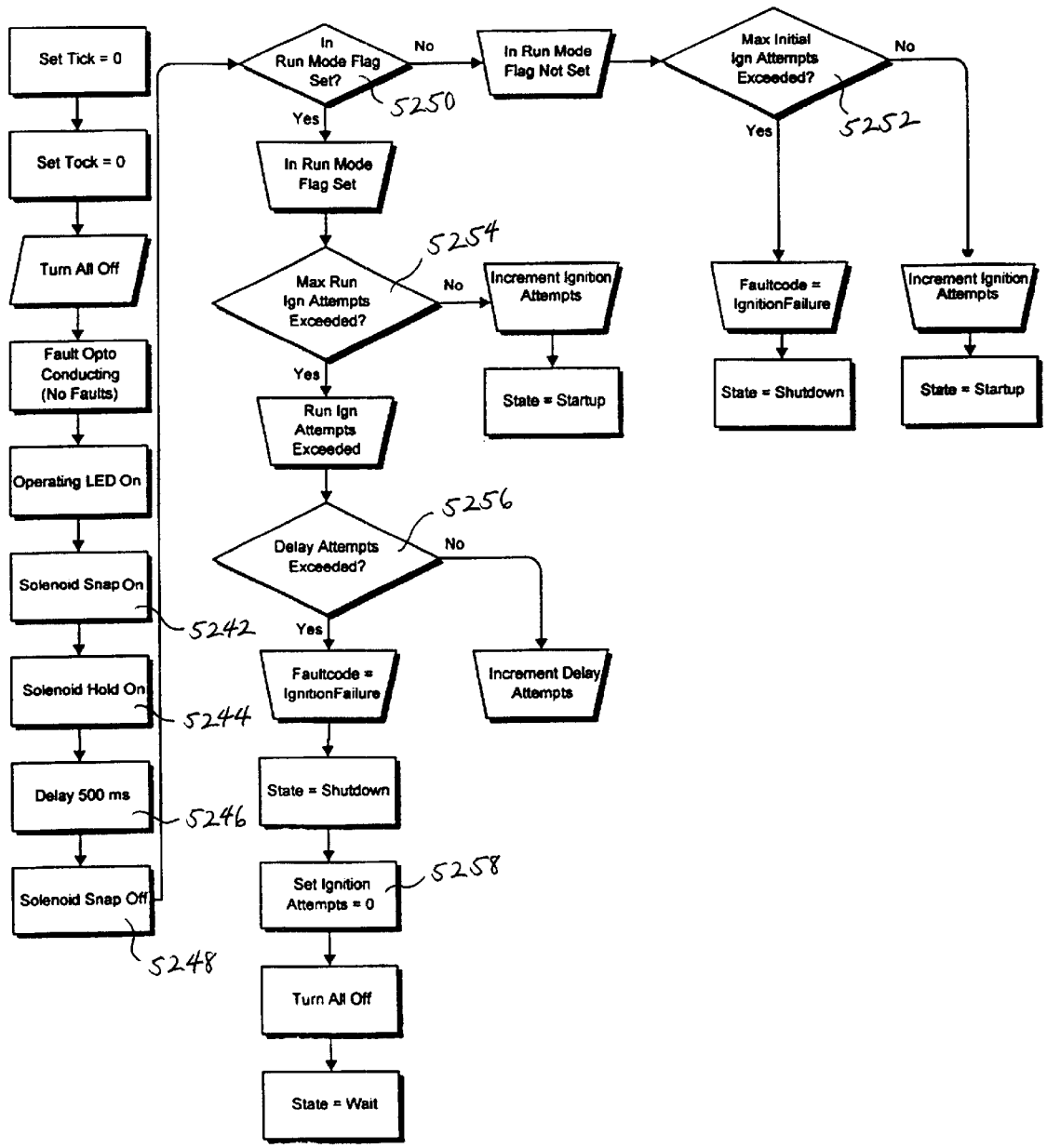
FIGURE 11   INITIAL STATE

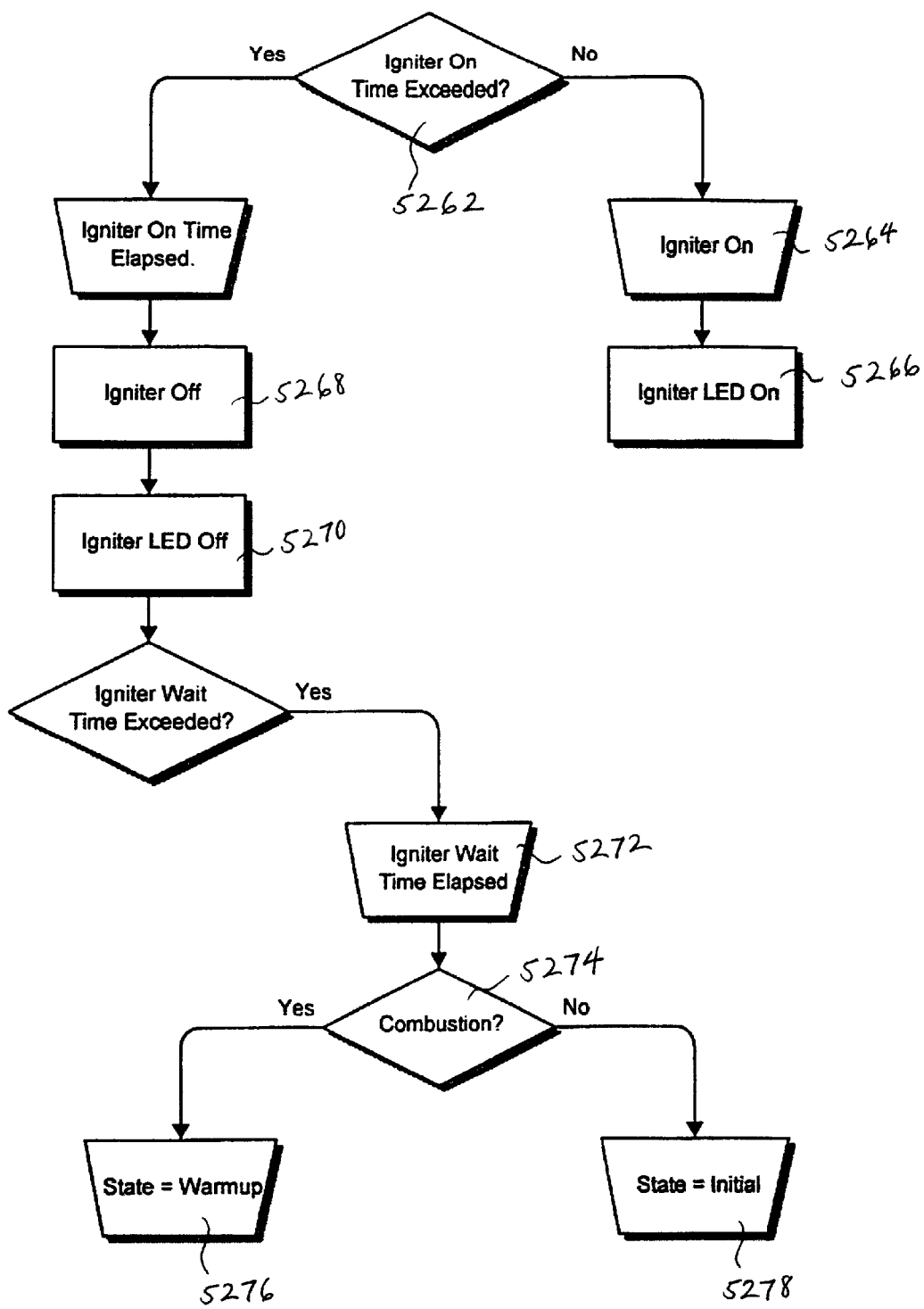
FIGURE 12  STARTUP STATE

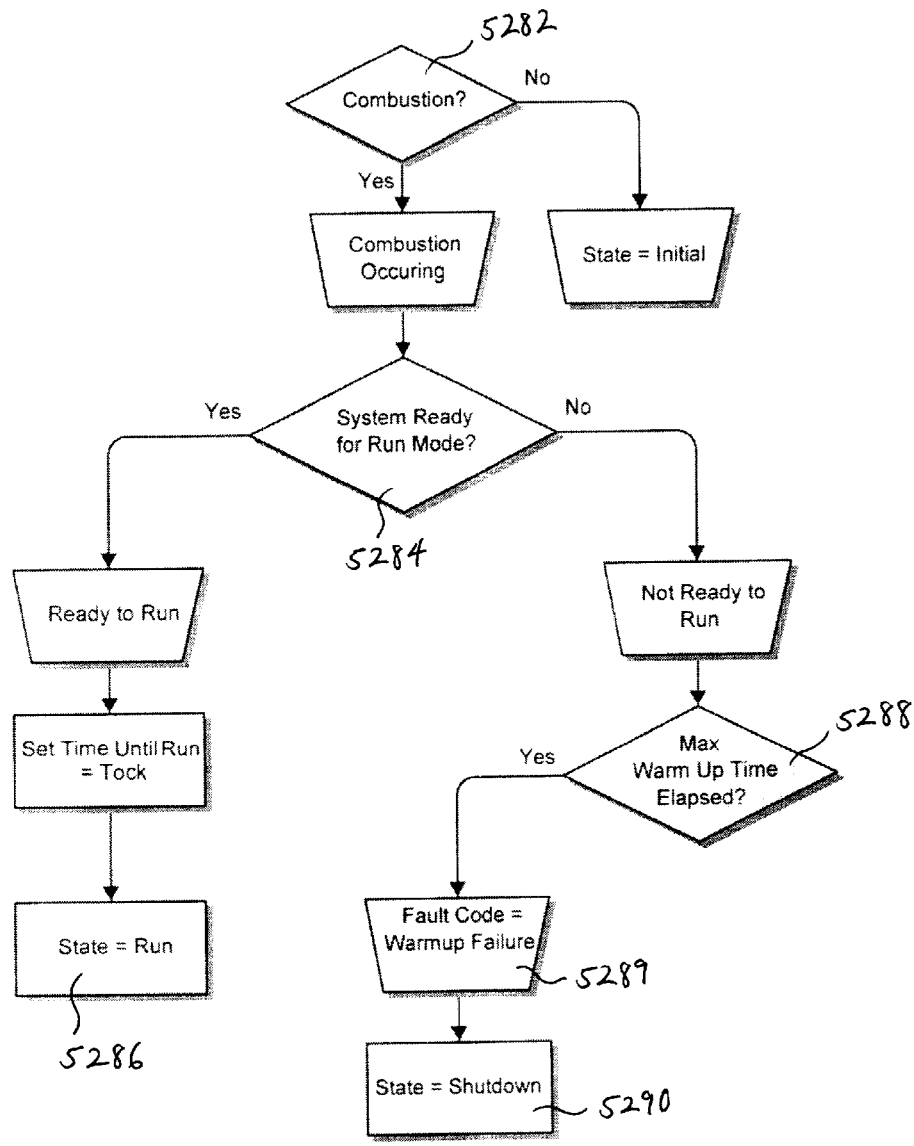
FIGURE 13 WARMUP STATE

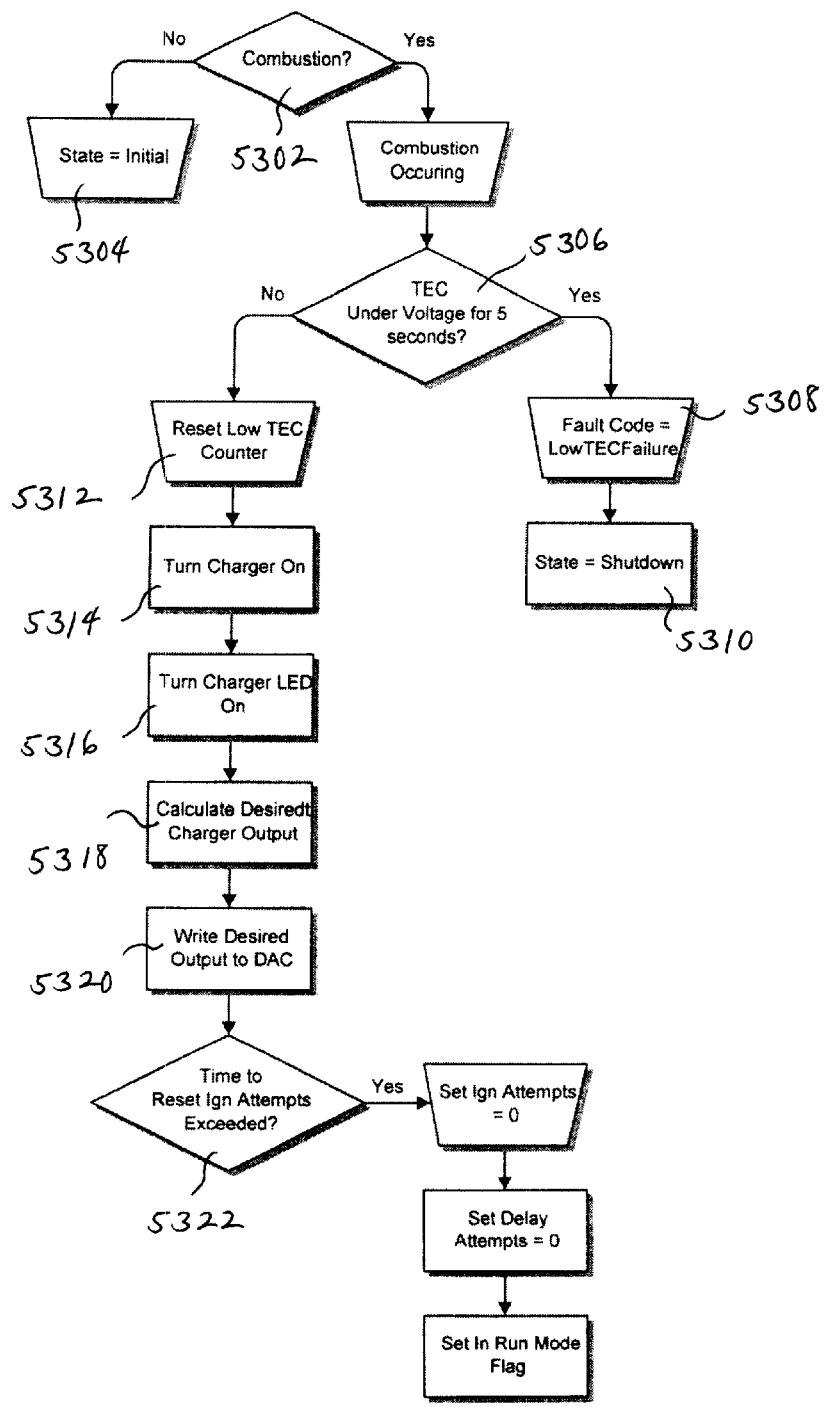
FIGURE 14  RUN STATE

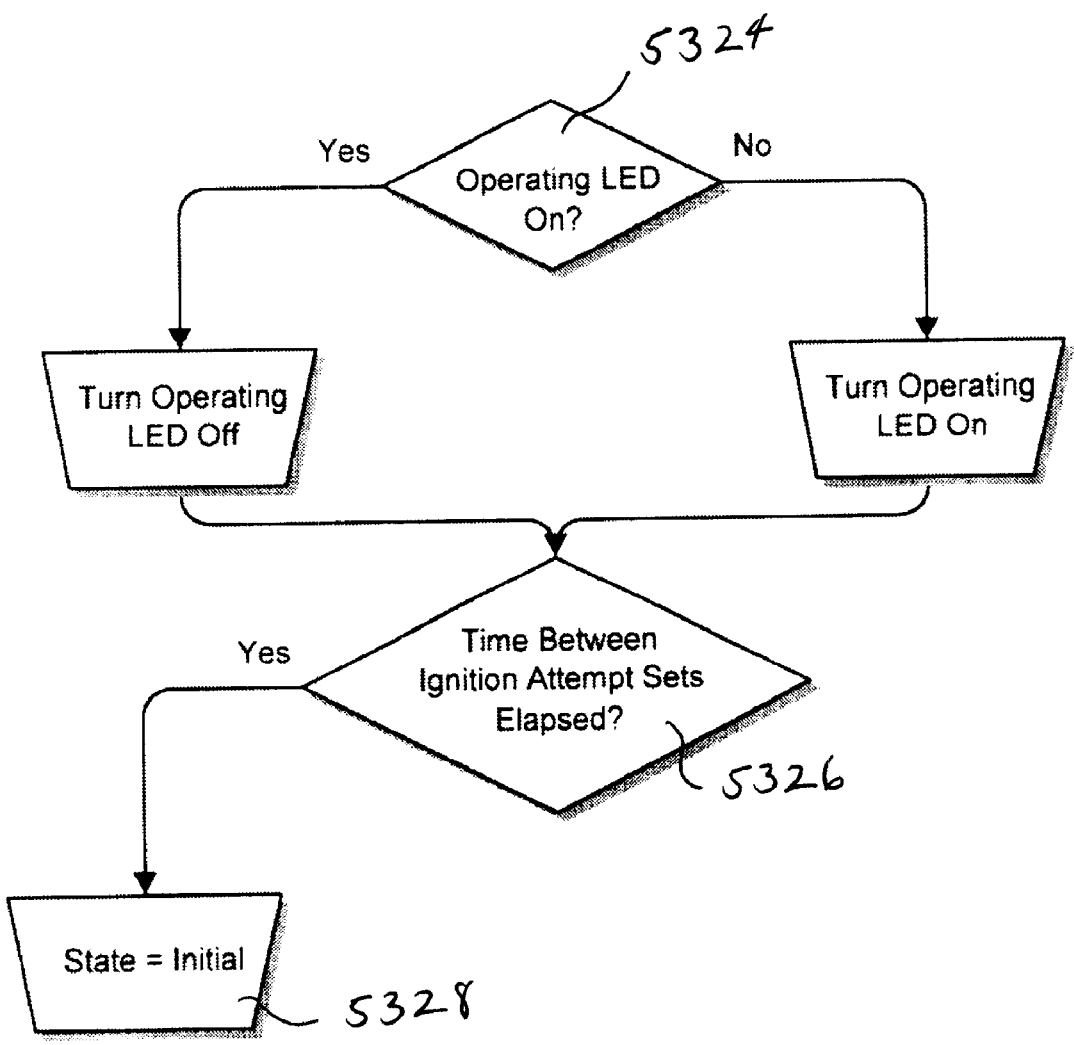
FIGURE 15 WAIT STATE

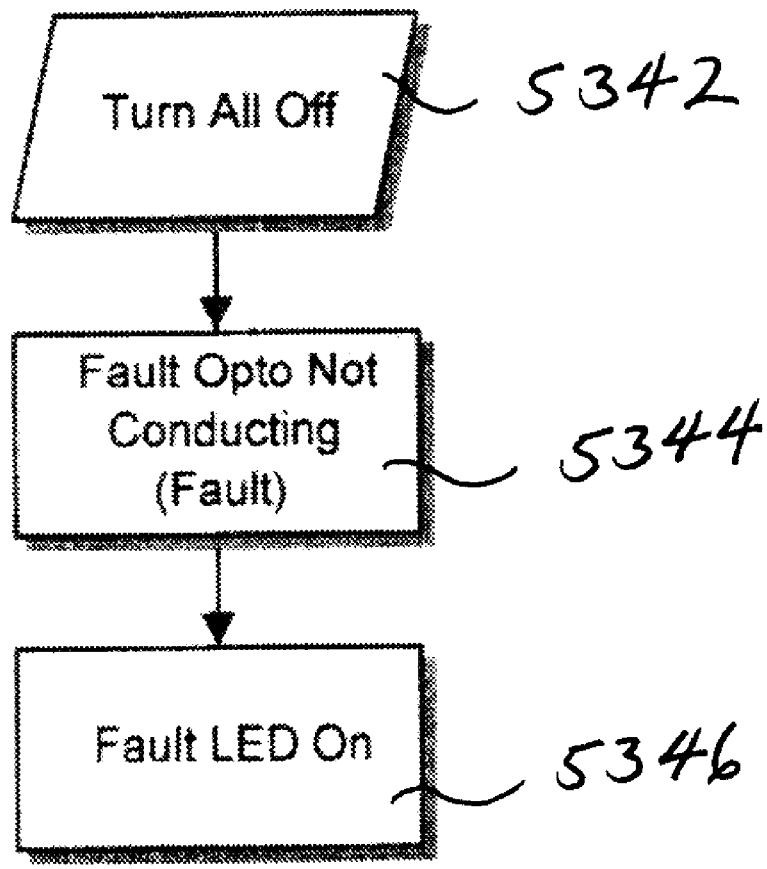
FIGURE 16  SHUTDOWN

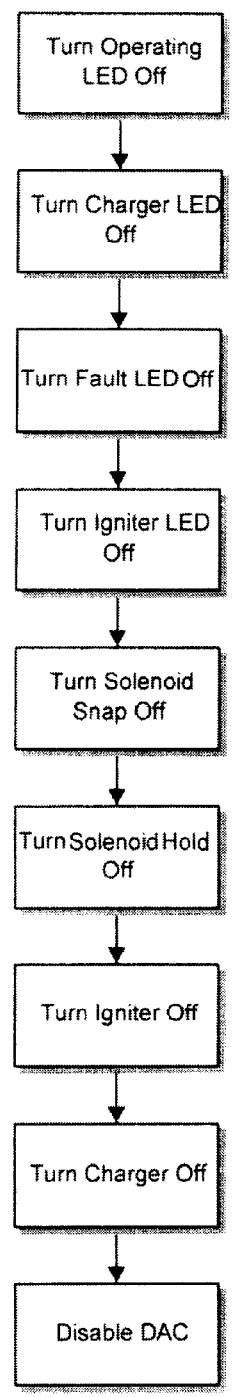
FIGURE 17  TURN ALL OFF

AUTOMATIC BURNER DRIVEN GENERATOR SYSTEM

CROSS-REFERENCE TO RELATED APPLICATIONS

This application claims the benefit of U.S. Provisional Application No. 60/205,296 filed on May 19, 2000.

BACKGROUND OF THE INVENTION

1. Field of the Invention

The subject automatic burner driven generator system is generally directed to a system for generating and maintaining sufficient electric power to drive a load. More specifically, the subject automatic burner driven generator system is one which operates in such highly automated and efficient manner that it provides reliable and safe electric power generation over an extended period of continuous service.

Moreover, the subject automatic burner driven generator system is adapted to provide such high levels of performance in substantially low power applications wherein, for example, output power levels even below 5 watts are required.

In numerous applications, there is a need for low levels of primary electric power at locations where established grid power is not readily available. An example of such an application is that of a remotely-located gas pipeline monitoring station. Typically, such monitoring stations are unmanned and located in remote regions without access to grid electric power; however, they do have a source of gaseous fuel (such as natural gas or propane) readily available. There is a need in these and other applications for a fueled power generator system which operates with sufficient reliability and automation to effectively permit one-switch operation following installation.

There is a need, moreover, for such a power generator system not only having low cost, but which exhibits low internal power consumption. There is a need for such power generator systems having microprocessor-based controls, integrated rechargeable battery charging, and sufficient communication capability.

2. Description of the Related Art

Power generation systems for supplying low levels of primary power at remote locations are known. Such power generation systems employing various types of technology are also known, but are generally deficient in a number of respects. For example, systems simply employing primary batteries are quite costly to maintain, and are prohibitively so in many cases. Systems employing solar power devices are neither cost effective nor reliable enough to be practicable within a broad range of geographic locations. The controllers in systems employing such power devices are not readily adaptable to other methods of energy conversion.

Power generation systems employing thermoelectric devices are also known. Such known systems, however, fail to offer the level of reliability to enable extended periods of unattended low power generation and sufficient battery charging. In many applications, such thermoelectric power generation systems are often prohibitively expensive and invariably operable to provide a satisfactory degree of reliability only at output power levels higher than would otherwise be desirable. Furthermore, such known thermoelectric power generation systems fail to offer efficient management of ancillary power needs and lack an integrated control system that, if necessary, actuates multiple re-ignitions of an incorporated burner device; supports simple and convenient diagnostic activities thereon; and, insures safe operation.

Other shortcomings of known thermoelectric power generation systems include their requisite need for specialized installation and drawn out initial startup procedures. They are not, therefore, adapted for 'one-switch' operation, as is the subject automatic burner driven generator system.

Specific prior art references known to the Applicant include U.S. Pat. Nos. 5,599,181; 4,131,413; 5,495,829; 5,335,730; 3,627,588; 3,881,962; 4,773,847; 5,422,826; 5,450,869; 5,604,758; 5,705,770; 5,753,383; 5,917,144; and, 6,019,098; as well as a Product Manual entitled *Telan/DACAP Engineering and Applications Manual* distributed by Teledyne Brown Engineering, March 1996. The systems disclosed in such prior art references, however, fail to disclose the combination of features incorporated in the subject automatic burner driven generator system for powering an external load.

For instance, U.S. Pat. No. 5,599,181 issued to Aoki, et al. is directed to a combustion apparatus having a built-in storage battery. The apparatus fails to incorporate control measures as comprehensive as that of the present invention, nor is the apparatus designed to power external loads. One example in this regard is that the apparatus fails to incorporate battery charging measures that are carried out in adaptive manner to optimize efficiency.

The TELAN commercial generator described in the non-Patent literature document does not incorporate control measures as programmable and highly automated as a microprocessor-based measures. Hence, it does not facilitate one-switch operation. Nor does it provide such features as automatic delayed re-light and built-in diagnostic operation.

U.S. Pat. No. 4,131,413 issued to Ryno is directed to a self-contained electric igniter wherein the ignition pilot is actuated by a rechargeable battery to generate a spark. The Patent, however, fails to disclose a microprocessor-based control system, much less such a control system that incorporates a comprehensive, highly automated set of control functions.

U.S. Pat. No. 5,495,829 is directed to a natural gas-powered, forced or induced draft water heater apparatus. The apparatus includes a thermoelectric module and a through-chamber heat sink. It incorporates a microprocessor controller for regulating the natural gas supply line and an electric blower that operates at approximately 4.0 volts. Nevertheless, the Patent fails to provide among its integrated control functions such things as communication capabilities, diagnostic capabilities, or acceptance testing features.

U.S. Pat. No. 5,335,730 issued to Cotham is directed to microprocessor-based activation of various valves to control the flow of liquids from a well head. The disclosed control measures, however, fail to incorporate the comprehensive combination of integrated control functions necessary to enable the degree of highly automated operation effected in accordance with the present invention. Furthermore, the control measures disclosed utilize as the preferred power source a solar array coupled to batteries. It is unclear, moreover, as to whether or not the disclosed control measures are operable at sufficiently low internal power consumption levels to realize low device costs.

There is, therefore, a need for a burner driven generator system operable in highly-automated yet efficient and economic manner. There is a need for such a generator system employing a comprehensive set of control measures sufficient to enable one-switch activation by a user and continual operation thereafter for powering a load over extended periods of time. There is a need for a generator system so operable even at low power levels.

SUMMARY OF THE INVENTION

It is a primary object of the present invention to provide a burner driven generator system for powering a load in highly automated yet efficient and reliable manner, even in low power applications.

These and other objects are attained in the automatic burner driven generator system of the present invention. The subject automatic burner driven generator system for powering a load generally comprises: a burner unit for generating thermal energy; a thermoelectric converter unit operatively coupled to the burner unit for transducing at least a portion of the thermal energy to a first electric power signal; a rechargeable battery unit operable to generate an output power signal for powering the load; a charging unit operably coupled to the thermoelectric converter and rechargeable battery units; and, a controller for automatically controlling the actuation of the units in programmed manner. The charging unit is operable to adaptively convert the first electric power signal to a second electric power signal for charging the rechargeable battery. The controller includes a microprocessor unit programmably configured to selectively actuate the units in accordance with a plurality of predetermined operational states.

In one preferred embodiment, the predetermined operational states include: initial, startup, warmup, run, wait, shut down, and test states. Also in one preferred embodiment, the battery unit includes an enabling portion which, in turn, includes a solenoid valve for selectively admitting the entry of a fuel from a fuel source into the burner unit and an igniter for igniting the admitted fuel. The solenoid valve in that embodiment is switchable between open and closed configurations; and, the rechargeable battery unit is operatively coupled to the burner unit for electrically powering the enabling portion. The solenoid valve is operably powered for transitioning between its open and closed configurations in the embodiment by at least a portion of the output power signal, whereafter the solenoid valve is operably powered for maintaining the open configuration thereof by an ancillary power signal.

Also in one preferred embodiment, the charging unit is operable responsive to the controller to generate the second electric power signal in temperature compensated manner relative to an ambient temperature parameter. The controller in one preferred embodiment includes a current limiter coupled to the charging unit for maintaining the first electric power signal at a current level no greater than a predetermined maximum current value.

BRIEF DESCRIPTION OF THE DRAWINGS

FIG. 1B is a parts list corresponding to the embodiment shown in FIGS. 1 and 1A;

FIG. 2A is a first portion of a parts list pertaining to the system portions shown in FIG. 2;

FIG. 2B is a second portion of a parts list pertaining to the system portions shown in FIG. 2;

FIG. 6 is a flow diagram illustrating an exemplary flow of functional steps during system operation in accordance with one embodiment of the present invention;

FIG. 7 is a flow diagram illustrating an exemplary flow of functional steps occurring during one operational state in accordance with one embodiment of the present invention;

FIG. 8 is a flow diagram illustrating an exemplary flow of functional steps occurring during one operational state in accordance with one embodiment of the present invention;

FIG. 9 is a flow diagram illustrating an exemplary flow of functional steps occurring during one operational state in accordance with one embodiment of the present invention;

FIG. 10 is a flow diagram illustrating an exemplary flow of functional steps occurring during one operational state in accordance with one embodiment of the present invention;

FIG. 11 is a flow diagram illustrating an exemplary flow of functional steps occurring during one operational state in accordance with one embodiment of the present invention;

FIG. 12 is a flow diagram illustrating an exemplary flow of functional steps occurring during one operational state in accordance with one embodiment of the present invention;

FIG. 13 is a flow diagram illustrating an exemplary flow of functional steps occurring during one operational state in accordance with one embodiment of the present invention;

FIG. 14 is a flow diagram illustrating an exemplary flow of functional steps occurring during one operational state in accordance with one embodiment of the present invention;

FIG. 15 is a flow diagram illustrating an exemplary flow of functional steps occurring during one operational state in accordance with one embodiment of the present invention;

FIG. 16 is a flow diagram illustrating an exemplary flow of functional steps occurring during one operational state in accordance with one embodiment of the present invention; and, FIG. 17 is a flow diagram illustrating an exemplary flow of functional steps occurring during one operational state in accordance with one embodiment of the present invention.

DETAILED DESCRIPTION OF THE INVENTION

Figure 1:
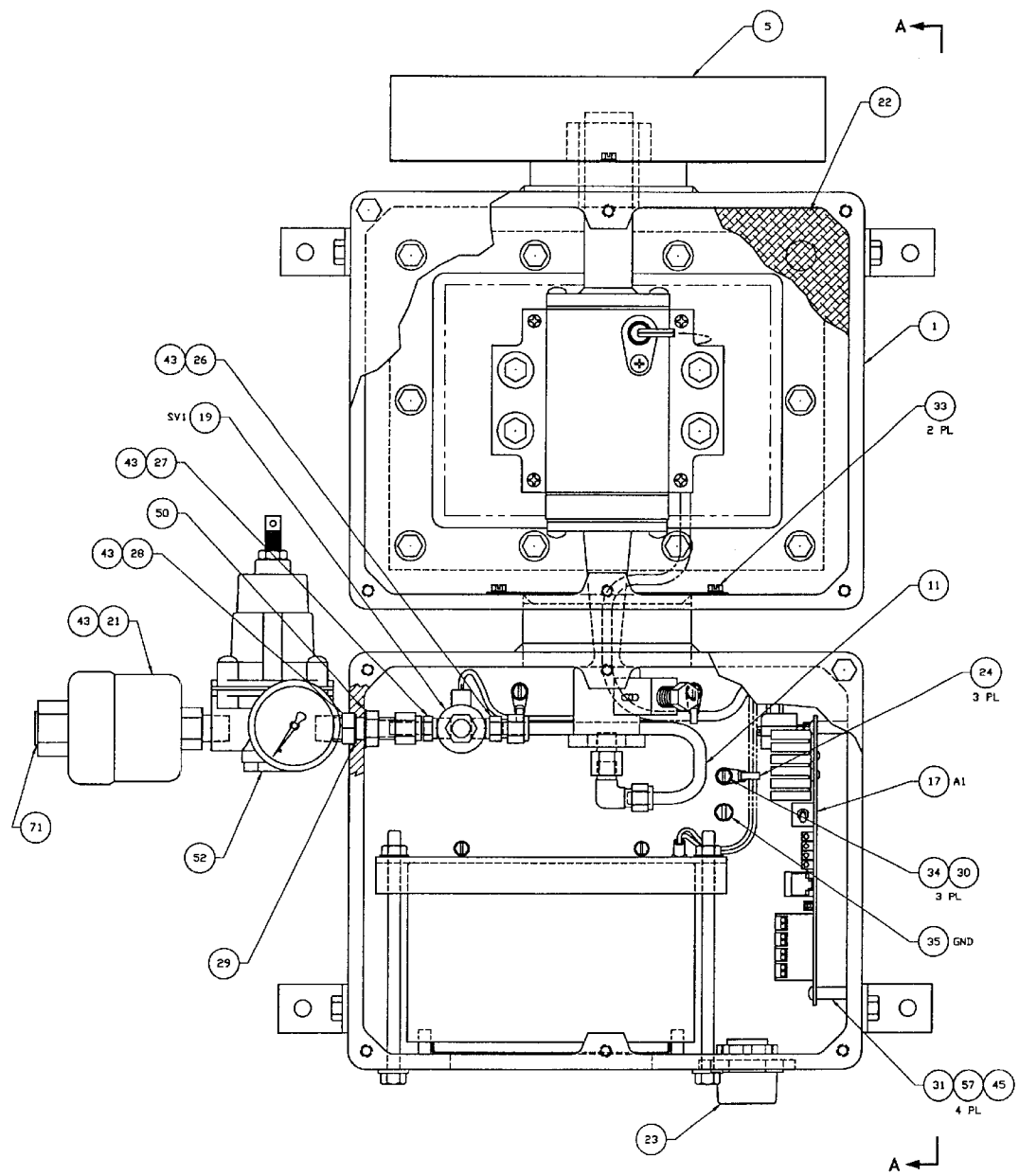
FIG. 1 is a front elevational assembly view, partially cut-away, of one embodiment of the present invention.
Figure 1A:
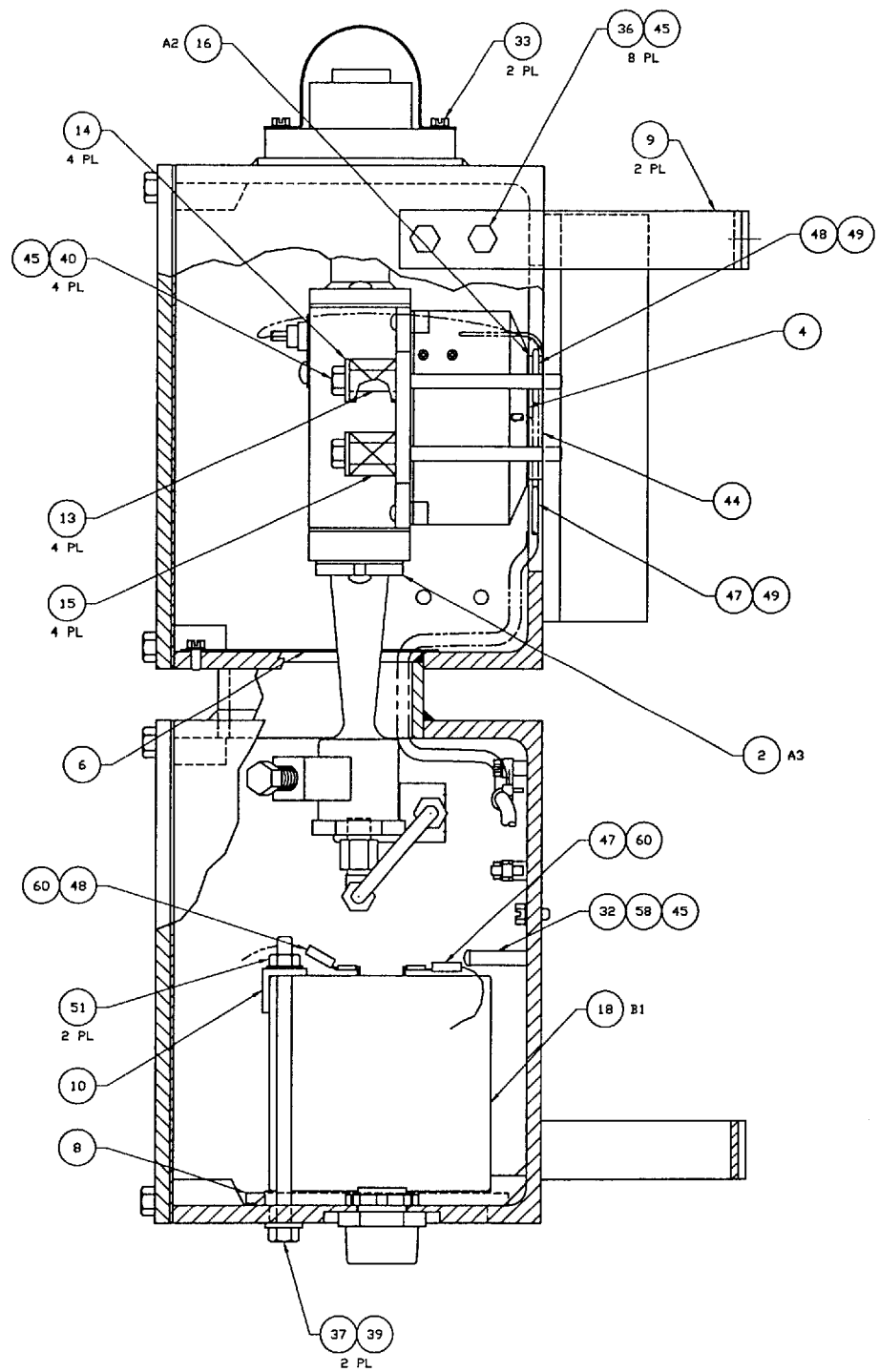
FIG. 1A is a side elevational assembly view, partially cut-away, of one embodiment of the present invention.
Figure 2:
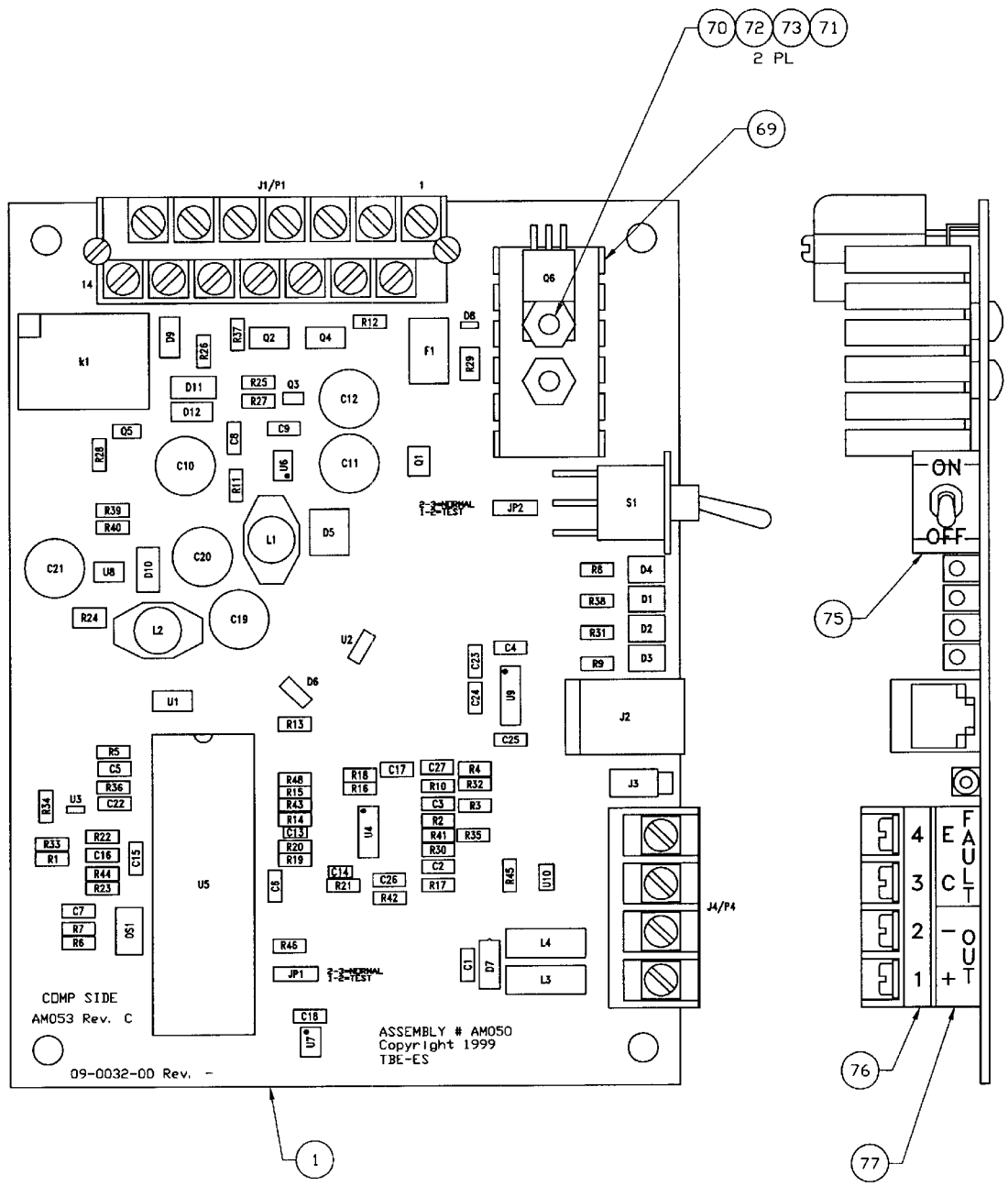
FIG. 2 is a component assembly drawing of system controller and battery charging portions of one embodiment of the present invention.

Referring now to FIGS. 1–2A, there are shown assembly drawings and corresponding components lists for an automatic burner driven generator system formed in one embodiment of the present invention. In the embodiment shown, a number of the various functional units of the system are housed within a substantially weather-tight enclosure 5.

The configuration, arrangement, and interconnection of components shown form but one exemplary embodiment of the subject automatic burner driven generator system. Numerous other embodiments may be realized in accordance with the present invention.

Figure 3:
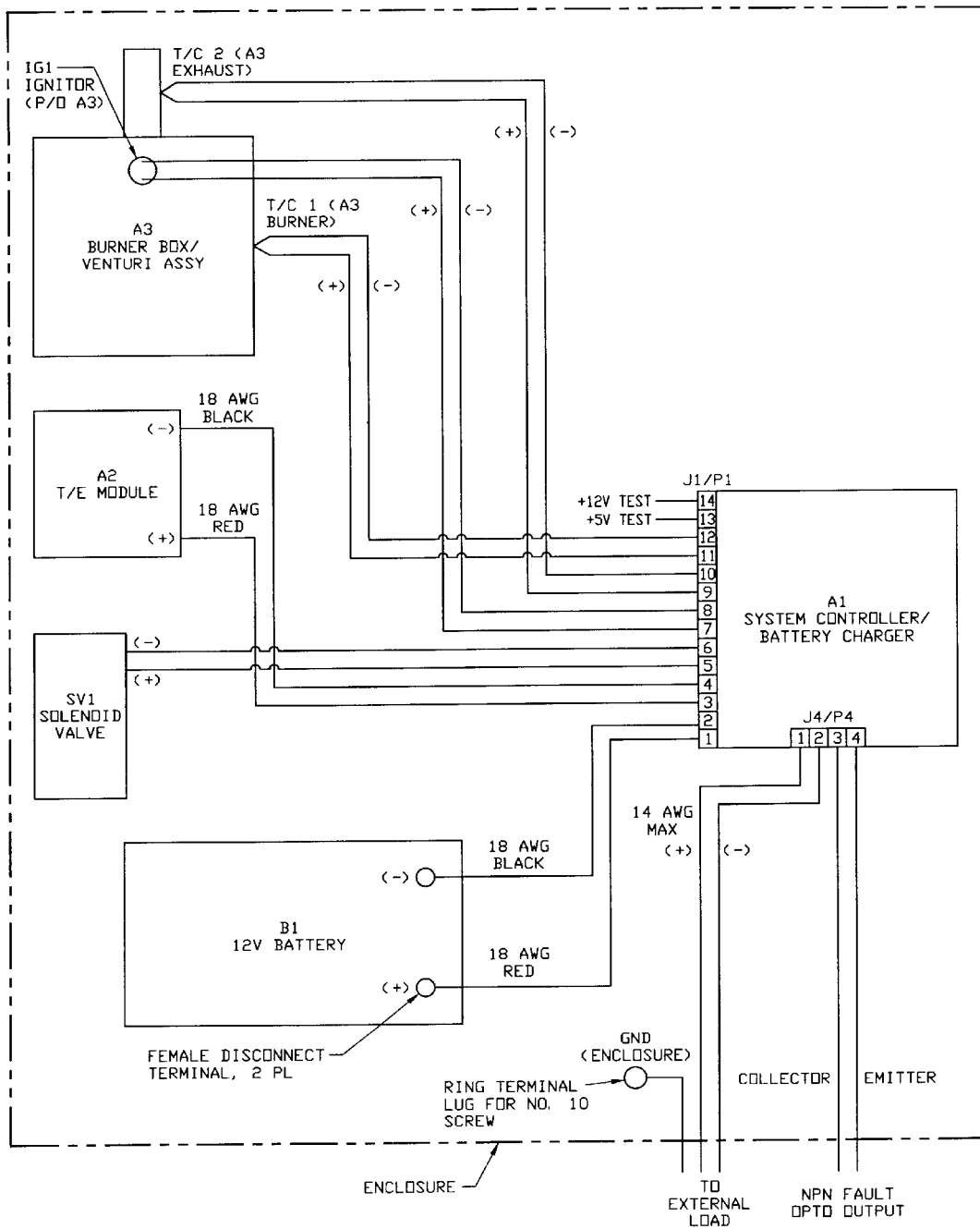
FIG. 3 is a wiring diagram schematically illustrating one embodiment of the present invention.
Figure 5:
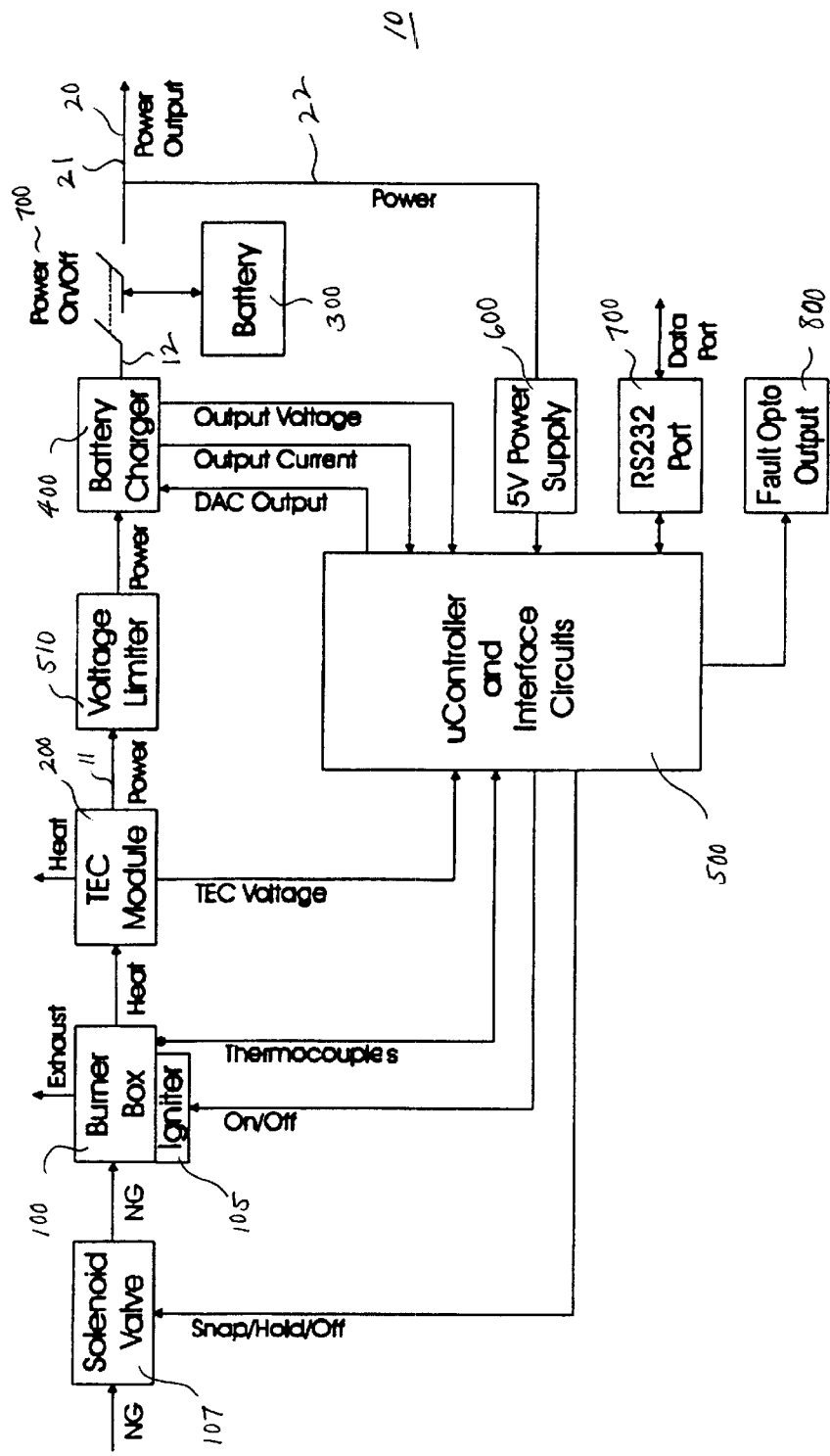
FIG. 5 is a block diagram illustrating the flow of signals between units in one embodiment of the present invention.

Referring now to FIG. 3 and 5, there is schematically shown an illustrative interconnection of units in an exemplary embodiment of the subject automatic burner driven generator system 10. System 10 in this embodiment generally comprises a fuel fired burner unit 100; a thermoelectric converter unit 200; a rechargeable battery unit 300; a battery charging unit 400 (shown as part of the controller), and a controller 500 coupled to the units for controlling their actuation in programmed manner. Units 100, 200, 300, 400 may be of any type known in the art suitable for the intended application.

Briefly, overall operation of system 10 occurs as follows under the control of controller 500. After system 10 is initially switched on by a user, burner unit 100 is activated to burn fuel (from a source not shown) to generate thermal energy. This thermal energy is transferred to thermoelectric converter unit 200 such that a thermal gradient is generated therein. Thermoelectric converter unit 200 transduces this thermal gradient to a first electric power signal that it applies to battery charging unit 400. Responsive to the applied electric power signal and one or more other condition-indicative parameters, battery charging unit 400 adaptively generates a second electric power signal which it then applies to rechargeable battery unit 300. Rechargeable battery unit 300 generates and maintains at output 20 an output electric power signal for powering an external load (not shown).

Controller 500 is programmably configured such that upon interruption of burner operation, it automatically initiates up to a predetermined number of burner unit re-ignition attempts. In doing so, controller 500 employs sufficient safeguards to shut the system down upon the occurrence of fault conditions serious enough to necessitate it. Absent such fault conditions, system 500 maintains the operation of system 10 to maintain the output electric power signal at acceptable levels.

Burner unit 100 preferably includes an enabling portion having an igniter 105 and a solenoid valve 107.

While not shown, a source of fuel for burner unit 100 is coupled via solenoid valve 107 to the unit's burner device. That fuel source provides, under the control of solenoid valve 107, a pressurized flow of natural gas, propane, or some other type of fuel which then is ignited within the burner device's combustion chamber. The burner device employed is thus a fuel fired burner device that sustains either a flame or flameless catalytic mode during steady state operation.

A flameless catalytic type burner is employed in the embodiment shown in FIGS. 1–2A. Briefly, in such devices, an initial combustion stage following ignition heats a bed of catalytic material disposed in the fuel flow stream. When the catalytic bed heats sufficiently to an equilibrium temperature corresponding to the catalytic material, the combustion stage gives way to a self-sustaining catalytic stage whereby the bed's catalytic reactions with the flowing fuel stream generates sufficient heat to maintain the catalytic bed at or near the equilibrium temperature to, in turn, sustain the catalytic reactions.

Each ignition or re-ignition attempt, whether at initial startup or following an interruption in system operation, occurs preferably in the following manner. Responsive to actuation, solenoid valve 107 which is coupled to a fuel source (not shown) obtains its open configuration to allow the fuel to flow into burner unit 100 and combine with air to form a combustible mixture. Subsequent energization of igniter 105, then ignites the combustible mixture.

Burner unit 100 further includes thermocouple devices disposed respectively at its exhaust (T/C 2) and burner (T/C 1) portions. These thermocouple devices enable controller 500 to monitor the temperature at the respective portions of burner unit 100 so as to first determine whether or not the most recent ignition attempt was successful, then to determine thereafter whether or not proper operation following ignition has sufficiently continued to prompt the activation of charging unit 400. Controller 500 makes the first determination based upon its monitoring of the exhaust thermocouple device. If a successful ignition is not indicated, controller 500 re-energizes igniter 105 after a predetermined delay interval of 30 seconds, for example, and maintains the energization for a predetermined time duration of 20 seconds, for example. As many as 4 or some other predetermined number of maximum consecutive attempts suitable for the intended application are made in this manner. If ignition remains unsuccessful over the maximum number of ignition attempts, controller 500 effects system shutdown and generates a corresponding ignition failure fault indication.

If, on the other hand, controller 500 detects a successful ignition, it monitors burner thermocouple device and one or more other parameters, such as the voltage of the first electric power signal generated by thermoelectric converter unit 200. If the temperature indicated by the burner thermocouple device and the output voltage of thermoelectric converter unit 200 remain following ignition at satisfactory levels over 20 continuous minutes (or some other predetermined time duration), controller 500 determines that conditions are acceptable for system operation and activates charging unit 400.

Turning again to FIG. 5, there is shown a block diagram illustrating the flow of signals between the various units of system 10 in accordance with one embodiment of the present invention. System 10 includes a power on/off switch 700 which, responsive to user actuation, selectively couples battery 300 to charging unit 400 and output terminal 20. Upon a user's power on actuation of switch 700, the solenoid valve and igniter 107, 105 of burner unit 100 are appropriately actuated to admit and ignite a fuel in the burner device of unit 100. Once appropriate start-up conditions are satisfied, controller 500 activates battery charging unit 400 to receive a first electric power signal 11 generated by thermoelectric converter unit 200 and adaptively generate an ambient condition-compensated second electric power signal 12 for charging battery unit 300.

It is important in accordance with the present invention to maintain the operation of charging unit 400 within a predetermined operating range on the unit's characteristic power output curve. This is graphically illustrated in FIG. 5A. Preferably, the power output performance of charging unit 400 is maintained, in part, by incorporating a voltage limiter 510 which insures that the first electric power signal 11 does not exceed a predetermined maximum level in electric potential. The desired power output performance is also preferably maintained, in part, by providing current limiting measures (see FIG. 4) within controller 500 to insure that the first electric power signal 11 is maintained at a current level no greater than a predetermined maximum level. The efficiency of charging unit 400, and therefore of system 10, is thus optimized.

In the embodiment shown, the rechargeable battery unit includes one or more rechargeable lead acid gel cell batteries generating an approximately 12-volt DC power output. This is but one example of numerous battery types and operational ratings that may be employed in accordance with the present invention, and it is to be understood that the present invention is not limited to the battery type and rating illustratively shown herein. In any case, the battery employed defines a characteristic float range—that is, the desired voltage range corresponding to a given ambient temperature at which the battery ought to be maintained for maximum service life. This float voltage range typically varies with ambient temperature, tending to change in inverse relation to changes in ambient temperature.

Figure 5A:
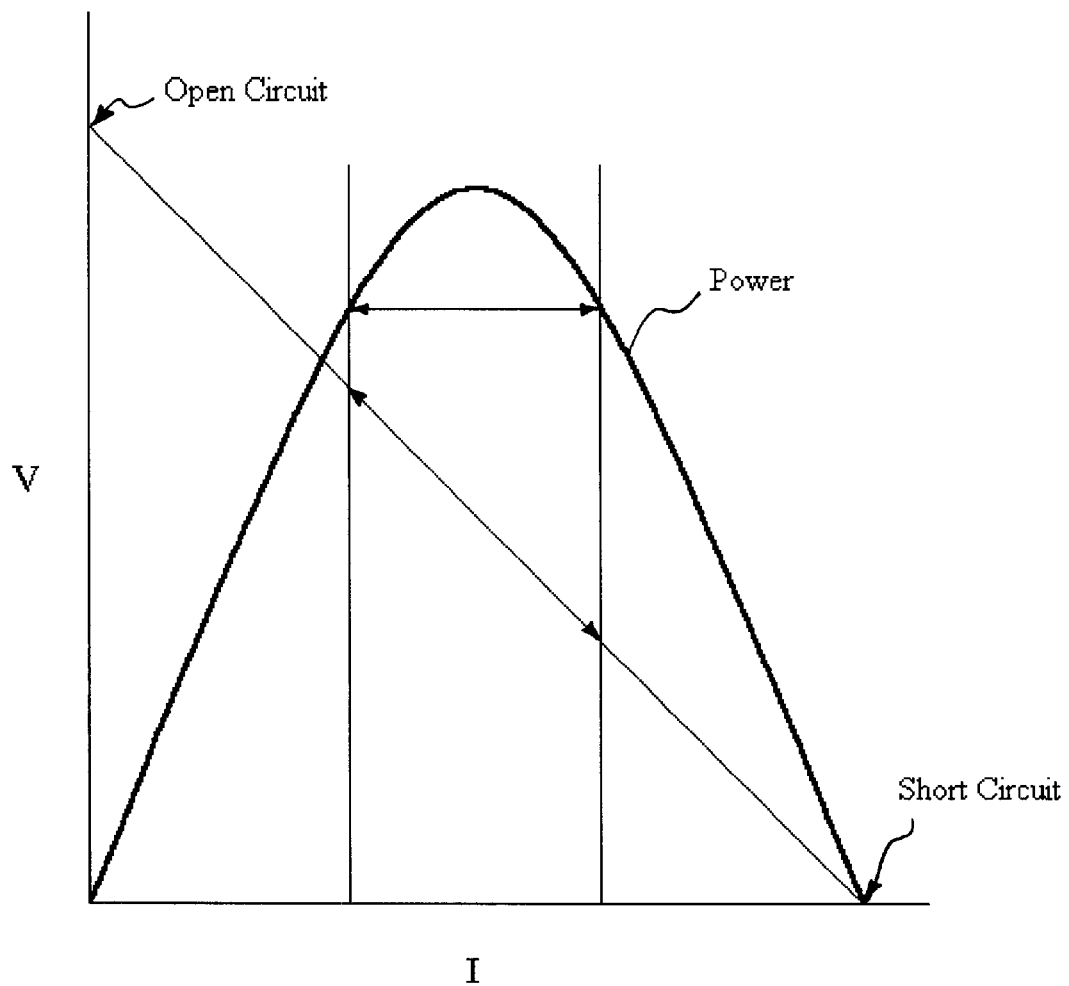
FIG. 5A is an explanatory diagram graphically illustrating power output characteristics of a thermoelectric converting device.
Figure 5B:
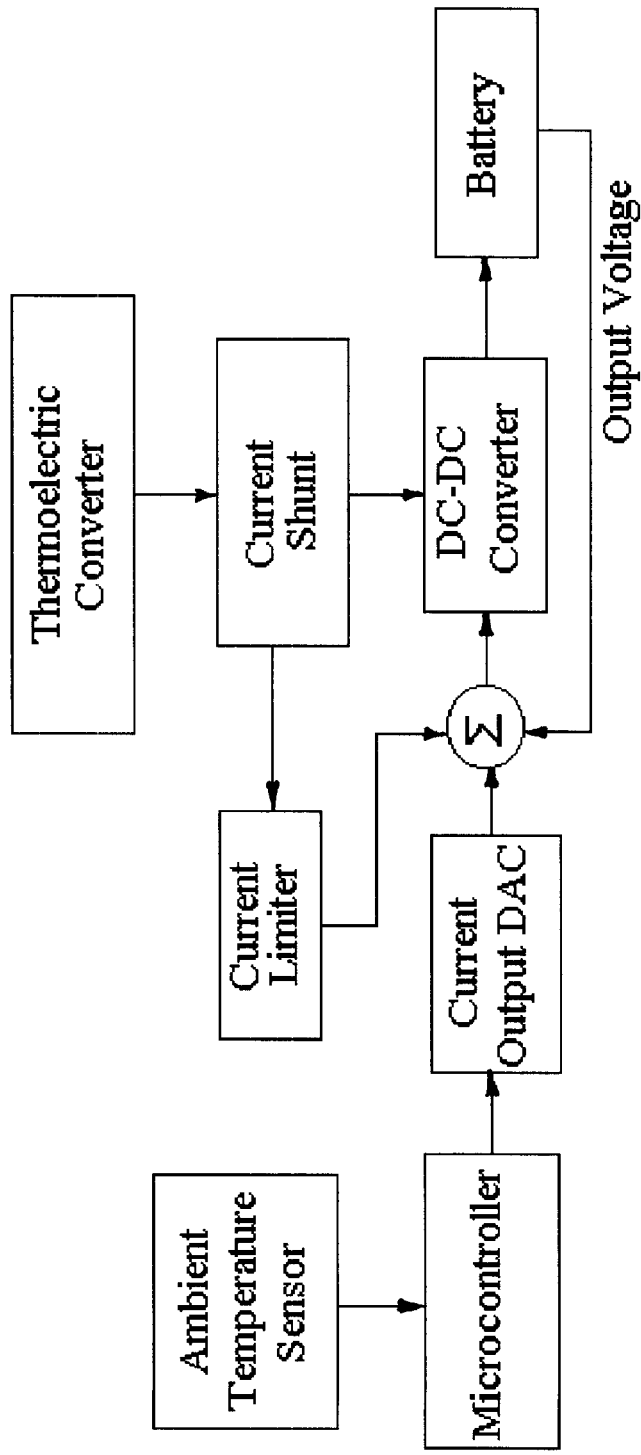
FIG. 5B is a block diagram illustrating the flow of signals between devices within a portion of one embodiment of the present invention.
Figure 5C:
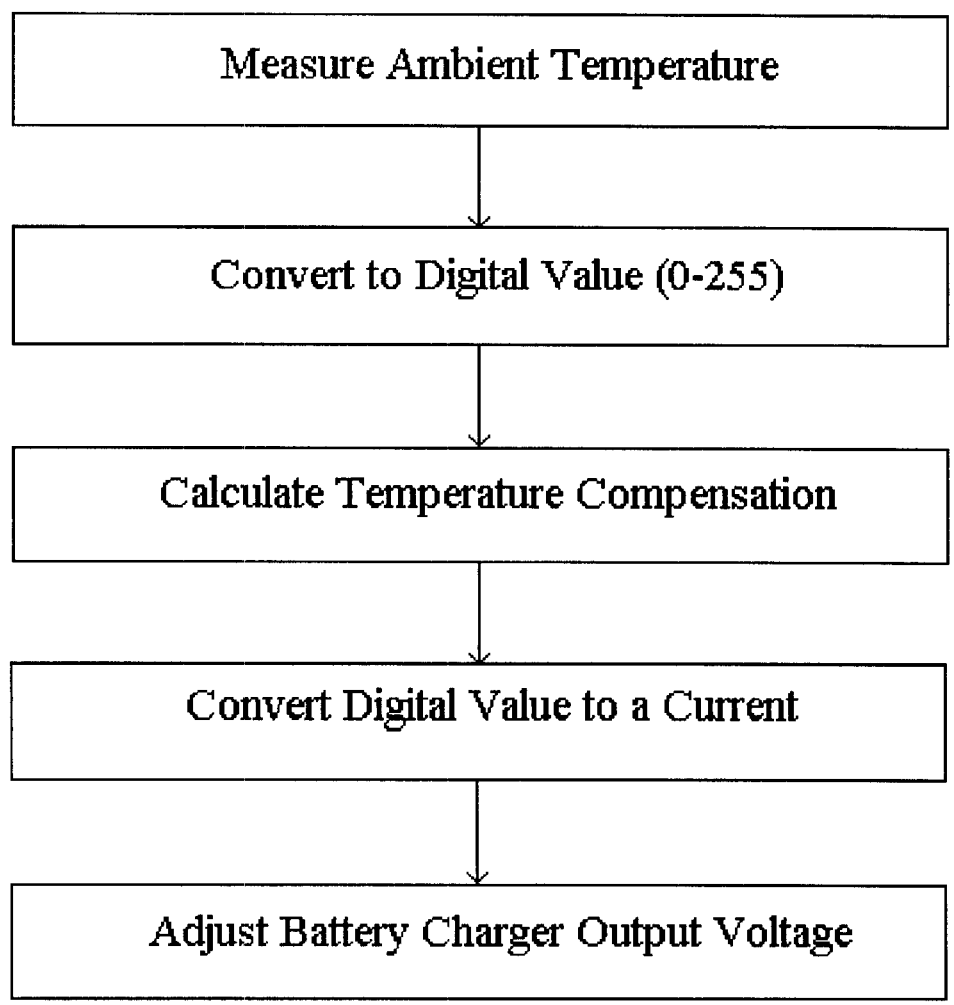
FIG. 5C is a flow diagram illustrating an exemplary flow of functional steps in accordance with one embodiment of the present invention to carry out temperature compensation.

Preferably, controller 500 is programmably configured to adaptively determine the float voltage range pertaining to the given battery unit 300 based upon a monitored ambient temperature measure. Controller 500 adaptively causes the second electric power signal 12 generated by charging unit 400 to reside within the prevailing voltage float range. Block and flow diagrams for effecting such temperature compensation in the disclosed exemplary embodiment are shown in FIGS. 5B and 5C. For the disclosed application, the charging voltage—or the voltage of the second electric power signal 12—is controlled effectively in accordance with the following equation:

Charging voltage (V)=14V−(0.025V/° C.×ambient temperature(° C.))

At least a portion 22 of the output power signal 21 generated at output terminal 20 is fed back to a power supply unit 600 that receives signal 22 and generates responsive thereto at least one ancillary power signal for powering controller 500 and one or more of the other system units. The ancillary power signal preferably powers the DC-DC converter of charging unit 400, as well as power supply unit 600 which in turn powers the microprocessor, operational amplifiers, and other active components.

Preferably, power supply unit 600 includes a DC-DC converter which converts feedback power signal 22 to a lower potential DC ancillary power signal (a 5V signal in the embodiment shown). This lower voltage ancillary power signal is employed in coordination with the higher voltage output power signal in some instances to further optimize the efficiency of system power management. During a burner unit ignition attempt, for instance, the power output of battery unit 300 is momentarily applied to solenoid valve 107 to energize the valve's transition to its open configuration, while the lower voltage ancillary power signal is applied to energize igniter 105. Solenoid valves generally require greater power to open than to keep open. Upon the valve's transition to its open configuration, therefore, controller 500 immediately replaces the battery output power signal with the lower voltage ancillary power signal to continue powering solenoid valve 107. This reduces considerably the aggregate power that solenoid valve 107 consumes.

Controller 500 includes at least one microprocessor control device programmably configured to manage and execute the various automated functions of system 10. Controller 500 also includes various interface circuitry to enable interactive communication with each of the system's units and their components. Preferably, controller 500 is equipped with at least one data port, such as an RS232 port by which a user may gain data communication access thereto.

Referring now to FIG. 6, the microprocessor device of controller 500 is programmably configured in the embodiment shown to execute as needed one or more predetermined operational states including: initial, startup, warmup, run, wait, shut down, and test states. The general flow diagram shown illustrates the functional flow executed by controller 500 in one exemplary embodiment of the present invention. As shown, initial system power up 510 prompted by user actuation of switch 700 is followed by an initialization step 512 wherein, as shown in greater detail in FIG. 7, various ports and channels are set up; various parameters are reset; and various timers and interrupts are enabled. Following initialization, a periodic timer overflow interrupt sequence (as illustrated in greater detail in FIG. 8) is initiated at block 514 whereby watchdog timer check and update functions are periodically carried out thereafter—at a rate of 122 times/second in the given embodiment. The flow eventually proceeds then to block 516 wherein various system parameter values are read in and stored, as illustrated in greater detail in FIG. 9.

The various parameter inputs are next checked at block 518 to insure system integrity. Referring to FIG. 10 which illustrates in greater detail the functional steps executed at block 518, checks are made at block 5182, for example, of the voltage output at battery unit 300. If the voltage is found to be below a preset nominal value (of 10 volts, for instance) over a preset time interval (5 seconds in the example shown), the appropriate fault code is set and the shut down sequence illustratively shown in FIGS. 16 and 17 is initiated. If the battery voltage passes the check, a check is made at block 5184 as to whether or not the exhaust thermocouple device of burner unit 100 is operative. If the exhaust thermocouple device is found to have remained open over 5 seconds, or some other preset maximum time interval, a broken exhaust thermocouple device 115 is declared, the appropriate fault code is set, and the shut down sequence is initiated. If exhaust thermocouple device is found operative, a similar check is made at block 5186 of the burner unit's burner box thermocouple device. Again, if the check indicates a broken thermocouple device, the appropriate fault code is set, and the shut down sequence is initiated. If the burner thermocouple device is found operative, however, a check is made at block 5188 of the burner box combustion temperature at burner unit 100. Again, if this temperature is found to exceed a preset maximum temperature (370° C., for instance) over 5 seconds, or some other preset maximum time interval, the appropriate fault code is set and the shut down sequence is initiated. If the check indicates a satisfactory burner box combustion temperature, however, the flow proceeds to the various system operational states following a further check at block 520 as to whether a test mode jumper has been set.

At block 522 controller 500 selectively executes the various operational states which include in the embodiment shown: initial 524, startup 526, warmup 528, run 530, wait 532, shut down 534, and test 536. Ignition and re-ignition attempts of burner unit 100 are carried out in the initial and startup states 524, 526. The warmup state 528 is operative immediately following the startup state 526 to permit time for system conditions to attain sufficient levels for full operation in the ensuing run state 530. The system enters the wait state 532 where burner unit 100 combustion is lost during the system's operation in the run state 530. The wait state 532 insures that sufficient time has elapsed before another set of ignition attempts is carried out. The shut down state 534 is entered promptly upon the occurrence of various preset fault conditions so as to avoid hazardous conditions. The test state 536 is invoked by an appropriate jumper setting on controller 500 for quick-testing various inputs and outputs, primarily during system manufacture.

The flow of functional steps executed in the initial state 524 are illustratively shown in FIG. 11. In this state which is preferably entered immediately following a user's switching on of system 10, the normally closed solenoid valve 107 of burner unit 100 is energized by the battery output power signal at block 5242 to snap on to its new open configuration, opening the flow of fuel from a source into the burner device of unit 100. Solenoid valve 107 is held by the battery output power signal in its open configuration at block 5244. Following a predetermined delay of preferably 500 ms, as indicated at block 5246, the 'snap on' state of solenoid valve 107 is terminated at block 5248. Solenoid valve 107 continues to remain open beyond this point, but more efficiently remains energized by the lower voltage ancillary power signal rather than by the battery output power signal.

The flow next proceeds to block 5250 where a check is made as to whether or not if a system in run mode flag is set. If not, a check is made at block 5252 as to whether or not the preset maximum number of initial ignition attempts has been exceeded, so as to either increment the ignition attempts count and prompt the start-up state or to set the appropriate fault code and prompt the shutdown state. If the in run mode flag is set, a check is made at block 5254 as to whether or not the maximum number of run ignition attempts has been exceeded. If it has not, the ignition attempts count is incremented and start-up state prompted. If it has been exceeded, a check is further made at block 5256 as to whether or not the number of delayed attempts has been exceeded. If not, the start-up state is prompted. Otherwise, the appropriate fault code is set, and the weight state is prompted following shutdown and a clearing at block 5258 of the ignition attempts count.

The flow of functional steps executed in the startup state 526 are illustratively shown in FIG. 12. In this state, a check is first made at block 5262 as to whether or not igniter 105 of burner unit 100 is already energized; and if so, whether it has remained on for a period exceeding a preset maximum time (which in the exemplary embodiment shown is preferably set at 20 seconds). If the check at block 5262 returns a negative, igniter 105 is energized and its corresponding LED indicator is turned on at block 5266. If the check at block 5262 indicates that the preset igniter on time has elapsed at block 5272, a check is made at block 5274 as to whether or not combustion has successfully occurred in burner unit 100 upon the ignition attempt. Successful combustion is confirmed by checking the sensed voltage output of the burner unit's exhaust thermocouple device (to effectively sense a flame). In exemplary applications, the threshold temperature indicative of successful combustion is set at approximately 260° C. If combustion is successful, the warmup state 528 is invoked at block 5276. Otherwise, the initial state 524 is invoked at block 5278.

The flow of functional steps executed in the warmup state 528 are illustratively shown in FIG. 13. Combustion is confirmed at the outset in this state at block 5282. Upon confirmation that combustion is in fact occurring, the flow proceeds to block 5284 where a check is made as to whether or not system 10 is ready for full operation in the run mode 530. Various threshold checks are made in block 5284 of preselected parameters preferably including the temperature sense voltage of the burner unit's thermocouple device and the open circuit output voltage of thermal electric converter unit 200. In an exemplary embodiment, the threshold levels for these parameters are respectively set at approximately 367° C. and 3.5V. Where these parametric thresholds are exceeded, the run state 530 is invoked at block 5286.

Otherwise, a check is made at block 5288 as to whether or not a preset maximum warmup time interval has elapsed. If it has, a warmup failure fault is declared and the shut down state 534 is invoked at block 5290 after the appropriate fault code is set at block 5289.

The flow of functional steps executed in the run state 530 are illustratively shown in FIG. 14. A check is also made at the outset in this state at block 5302 to confirm that combustion is still occurring. If it is not, the initial state 524 is again invoked at block 5304. Otherwise, full operation of system 10 is activated such that battery charging unit 400 operates to continually restore the charge of battery unit 300 so that it may deliver power to an external load (not shown) coupled at output terminal 20. Preferably, after system 10 has been operating in the run state uninterrupted for a predetermined time interval (60 minutes, for example), the number of permissible re-ignition attempt sets and the number of re-ignition attempts within an attempt set are reset to appropriate predetermined values. In the exemplary embodiment shown, the parameters are respectively set at 4 and 2. If system operation is interrupted for some reason, this permits controller 500 to initiate as many as 4 sets of 2 consecutive re-ignition attempts. Consecutive re-ignition attempt sets would then be separated by at least a five hour delay, or some other predetermined time delay during which system 10 remains in the wait state 532. While system 10 is operating in its normal run state 530, the thermoelectric converter unit 200 output voltage is continually monitored at block 5306 for a sustained undervoltage condition. If this thermoelectric converter unit voltage drops below a predetermined threshold level (nominally 1.75V in the exemplary embodiment shown) for as long as 5 seconds, or some other predetermined maximum time duration, a fault is declared, and the shut down state is entered at block 5310 after the appropriate fault code is set at block 5308.

If, upon entering the run state 530, no undervoltage condition is detected in the initial check made at block 5306, a low TEC counter is reset at block 5312, and charging unit 400 and its corresponding LED indicator are turned on at blocks 5314 and 5316. The flow then proceeds to blocks 5318 and 5320 wherein the temperature-compensated charging unit output is calculated and converted by a digital-to-analog converter, then applied to charging unit 400 as shown in FIGS. 5B and 5C. At block 5322, the time elapsed since entry of the given run state is checked to determine whether or not it exceeds the predetermined minimum time interval (of 60 minutes); and, parameters for ignition attempts and delay between attempt count are reset to zero. An In Run Mode flag is then set.

The flow of functional steps executed in the wait state 532 are illustratively shown in FIG. 15. A check is initially made in this state at block 5324 as to whether or not an Operating LED (which is turned on upon the occurrence of the initial state 524) is in fact turned on. Whether it is on or off, the Operating LED is toggled to its opposing state. A check is then made at block 5326 as to whether or not the predetermined time period allowed between attempt sets has elapsed. If sufficient time has elapsed, the initial state 524 is invoked at block 5328.

The flow of functional steps executed in the shut down state 534 and its attendant device turn off sequence are illustrated in FIGS. 16 and 17. During operation of system 10, controller 500 continually monitors for the occurrence of various fault conditions. It actuates necessary safeguarding measures upon the detection of a plurality of recognized fault conditions which include the following (a number of which are described in preceding paragraphs):

1. Initial ignition failure which occurs after controller 500 has executed a predetermined maximum number (4, for example) of ignition attempts without prompting successful combustion of burner unit 100.
2. Re-ignition failure wherein the normal run state 530 operation of system 10 is disrupted by aberrant conditions such as fuel flow interruption or violent environmental conditions; and, the maximum number of re-ignition attempt sets fails to yield successful combustion of burner unit 100.
3. Warmup failure wherein system conditions fail to reach levels sufficient to prompt operation in the run state 530 within a predetermined maximum time interval following an apparently successful combustion within burner unit 100.
4. Low battery voltage fault wherein the voltage across the appropriate terminals of battery unit 300 drops below a predetermined threshold level for a sustained period during system operation.
5. Low thermoelectric converter voltage fault wherein the output voltage of thermoelectric converter unit 200 drops below a predetermined threshold level for a sustained period during system operation in the run state 530.
6. Broken exhaust thermocouple fault wherein an open circuit condition is detected in the burner unit's exhaust thermocouple circuit.
7. Broken burner box thermocouple fault wherein an open circuit condition is detected in the burner unit's burner box thermocouple circuit.
8. High burner device temperature fault wherein a burner device combustion temperature greater than a predetermined maximum level is detected.

Upon the occurrence of a fault condition, system 10 and its external load remain residually powered by battery unit 300 until it fully discharges. As shown at block 5342, however, the device turn off sequence illustrated in FIG. 17 is promptly carried out so as to avoid unsafe conditions. Controller 500 immediately invokes the shut down state whereupon the device turn off sequence shown in FIG. 17 is initiated at block 5342. The appropriate fault indicators are then set at blocks 5344 and 5346.

The test state 536 is invoked by an appropriate jumper setting or the like provided on controller 500. In this mode, all digital outputs of controller 500 are cycled on and off. Additionally, all analog inputs are read and their values transmitted via an RS232 or other data link for diagnostic analysis.

Turning more closely now to an exemplary implementation of controller 500, controller 500 preferably incorporates one or more microprocessor devices suitably configured to execute the necessary software for carrying out the various automatic functions described herein. Preferably, controller 500 incorporates a microprocessor device having a 5-channel, 8-bit analog-to-digital (A/D) port built in, and including at least one serial peripheral interface (SPI) and at least one serial communications interface (SCI). The incorporated software operates with a timer interrupt that occurs 122 times per second, and includes an interrupt service routine which takes A/D readings, determines the current state, writes to an 8-bit D/A converter, checks for system faults, and performs other such necessary functions.

The microprocessor device preferably utilizes a ceramic resonator as its oscillator. While other comparable devices may be utilized, such resonators are typically of low cost yet are sufficiently accurate for serial communication applications. The microprocessor device employed preferably also incorporates power on reset/brownout protection measures to insure that controller 500 operates satisfactorily even under low battery charge conditions. Moreover, the microprocessor device employed utilizes a port configuration wherein a port designated port A receives system analog inputs, those ports designated ports B, C, and D make available the system's digital outputs, and a port designated E is reserved for communications.

The following Tables A and B describe in greater detail the various microprocessor device interfaces employed in the exemplary embodiment disclosed herein.

TABLE A

Microcontroller Interfaces

| Pin | Type | Name | Description |
|---|---|---|---|
| RD4 | Digital Input | Test Mode Jumper | Moving this jumper from the normal position (2–3 connected) to the test position (1–2 connected) causes the board to be put into the test mode. In the test mode all digital outputs are cycled on and off. All analog inputs are received and their values are transmitted over the RS232 link. This is intended to be used to speed functional testing during manufacturing. |
| RB0 | Digital Output | Battery Charger On/Off | The battery charger is enabled when this signal from the microcontroller goes low. |
| RB1 | Digital Output | Igniter On/Off | The igniter is turned on by applying current to the base of a power Darlington NPN transistor. A diode protects the NPN transistor from the igniter's inductive kick when it is turned off. |
| RB2 | Digital Output | Solenoid On/Off | See RB3 below |
| RB3 | Digital Output | Solenoid Snap/Hold | The solenoid valve driver requires two input signals. When the first input signal goes high, it turns on a NPN transistor that in turn fires a larger PNP transistor. The second signal turns on an N-channel mosfet. This puts about 11.5 volts across the solenoid causing it to open. After the valve has been opened for a predetermined |

TABLE A-continued

Microcontroller Interfaces

| Pin | Type | Name | Description |
|---|---|---|---|
| | | | period of time, the first input signal goes low. This causes the larger PNP transistor to turn off. Power to the solenoid is now provided from the 5-volt rail through a Schottky diode. This snap/hold approach greatly reduces the operating power of the solenoid valve. The low Rds (on) of the N-channel mosfet also saves power. If a system fault occurs, the second signal goes low. This turns off the N-channel mosfet closing the valve. |
| RB4 | Digital Output | Safety Shutdown LED | This LED is on when the generator is turned on and a system fault is present |
| RB5 | Digital Output | Generator on LED | This LED is on when the generator's main power switch is on powering both the generator and its external load. |
| RB6 | Digital Output | Charger on LED | This LED is on when the generator is in power generation mode. |
| RB7 | Digital Output | Igniter on LED | This LED is on when the igniter is on. |
| RB0 | Digital Output | Chip Select for SPI | |
| RD5 | Digital Output | Fault Opto Output | This output is pulled low when a system fault is present otherwise it is high. This causes the phototransistor, used in the optoisolator, to conduct under normal operating sequences. However, during a system fault the phototransistor does not conduct. The output of the isolator can be used to interface with other monitoring equipment. |
| RA0 | Analog Input | Exhaust Thermocouple | This thermocouple provides the exhaust temperature to the microcontroller. The thermocouple signal is low-pass filtered, amplified, and measured by the A/D. |
| RA1 | Analog Input | Burner Box Thermocouple | This thermocouple provides the burner temperature to the microcontroller. The thermocouple signal is low-pass filtered, amplified, and measured by the A/D. |
| RA2 | Analog Input | Ambient Temperature Sensor | This sensor provides the ambient temperature to the microcontroller. This reading allows the microcontroller to correctly compensate the battery charging voltage for different temperatures. The LM50 is used as the temperature sensor. Its output voltage is proportional to Celsius temperature (10 mV/° C.) and has a DC offset of +500 mV. The offset allows reading negative temperatures with a single supply. |
| RA3 | Analog Input | A/D Voltage Reference | The MX6125 is a low-cost, precision voltage reference. All A/D readings are based on this reference. |
| RA5 | Analog Input | TEC Voltage | The TEC voltage is divided, low-pass filtered, and measured by the A/D. |
| RE0 | Analog Input | Battery Charger Voltage | The battery charger voltage is divided, low-pass filtered, and measured by the A/D. |
| RE1 | Analog Input | Battery Charger Current | The battery charger current reading is amplified, low-pass filtered, and measured by the A/D. |
| RC7 | SCI Interface | Receive | See RC6 below. |
| RC6 | SCI Interface | Transmit | Pin RC7 and RC6 form the basis for the Serial Communications Interface (SCI). This interface allows the microcontroller to communicate with another computer or microcontroller. It boosts signal level to RS232 level to permit standard serial communications. This three wire serial connection connects to the system controller board through a keyed RJ11 connector (J2) and can be used for obtaining system information and diagnostics. |
| RC5 | SPI Interface | Serial Data Out | See RC3 below. |

TABLE A-continued

Microcontroller Interfaces

| Pin | Type | Name | Description |
|---|---|---|---|
| RC4 | SPI Interface | Serial Data In | See RC3 below. |
| RC3 | SPI Interface | SPI Clock | Pins RC5, RC4 and RC3 for the basis of the Serial Peripheral Interface (SPI) is a synchronous serial device that is integrated into the microcontroller. The SPI is used to control the 8-bit D/A converter that controls the battery charger output voltage. |

TABLE B

Power Interfaces

| Name | Description |
|---|---|
| Main Power Switch | A SPST sealed switch turns the unit on and provides power to the load at the same time. A PTC resistor acts as a resettable fuse protecting the system from prolonged damage as the result of a short circuit. A transient voltage suppressing zener diode protects sensitive equipment from spikes. |
| Battery Charger | The battery charger takes the TEC voltage and boosts it to a level suitable for battery charging. This charger is based on a PFM controller. It uses low ESR capacitors, a low DCR inductor, and low Rds (on) N-channel mosfet for increased efficiency. It has built in over-current protection. The charger has been designed to permit the solid state generator to operate at its optimum power point. The output voltage can be changed by the microcontroller through an 8-bit SPI DAC. This allows the microcontroller to control the charging profile of the battery to maximize system performance and extend battery life. When the DAC output is 0V, the battery charger output is 13.8 V. When the DAC output is 5V, the battery charger output is 12 V. |
| 5V Power Supply | The 5V-power supply is based on a PFM controller. It also uses a low ESR capacitor and a low DCR inductor for efficiency. It provides the power for the control logic and the solenoid valve. |
| Voltage Limiter | The voltage limiter prevents the TEC from reaching unacceptably high temperature by providing a load in the event that the TEC becomes too lightly loaded. |

One of the important advantages realized in accordance with the present invention is that of efficient power management, and the ability derived therefrom to operate at low power output levels on the order of 3 watts or less. An important feature in this regard is that the ancillary power consumption of system 10 is maintained at relatively low levels. An exemplary breakdown of the ancillary power consumption realized in the exemplary embodiment disclosed is shown in Table C.

TABLE C

Power Consumption (External Load = 2 Watts)

| | Power (Watts) |
|---|---|
| Solenoid | 0.11 |
| Controls | 0.05 |

TABLE C-continued

Power Consumption (External Load = 2 Watts)

| | Power (Watts) |
|---|---|
| Power Required @ 5V | 0.16 |
| 5V Load Total | 0.16 |
| 12V to 5V DC-DC Conversion Loss | 0.016 |
| External Load | 2 |
| Power Required @ 12V | 2.176 |
| 12V Load Total | 2.176 |
| Battery Charger DC-DC Conversion Loss | 0.435 |
| Necessary TEC Output Power | 2.611 |

As shown in Table C, system 10 consumes no more than approximately 0.611 watts of ancillary power in steady state operation (controller 500 and power supply 600 consuming less than approximately 0.2 watts). This low ancillary power consumption permits system 10 to operate reliably while producing approximately 3 watts of raw power. Such drawbacks as increased size, higher cost, and greater fuel consumption suffered to accommodate the greater gross levels necessitated in less efficient systems are thus avoided by the subject automatic burner driven generator system 10. As mentioned in preceding paragraphs, one factor contributing to the efficiency in power consumption is the responsive powering feature employed with solenoid valve circuit 107 whereby a low power hold is effected following the circuit's higher power snap on transition.

The highly efficient power management realized in accordance with the present invention is essential, especially in unmanned power generation applications at remote sites. If, for instance, the voltage and/or current of the power signal input to charging unit 400 are not adequately controlled to maintain the unit's operating point within the range shown in the characteristic power curve of FIG. 5A, a crippling depletion of power would likely result. Inappropriately charging battery unit 300 without regard to a careful monitoring of prevailing system conditions would yield similar results.

The subject automatic burner driven generator system 10 realizes such highly efficient power management while providing a comprehensive set of highly automated features like the automatic gas shut-off, burner re-ignition, and battery charging features disclosed herein. The subject system 10, moreover, offers such features in a manner that may be implemented at low cost, and in a manner that complies with Class I Division 2 Hazardous Environment Certification Requirements.

Figure 4A:
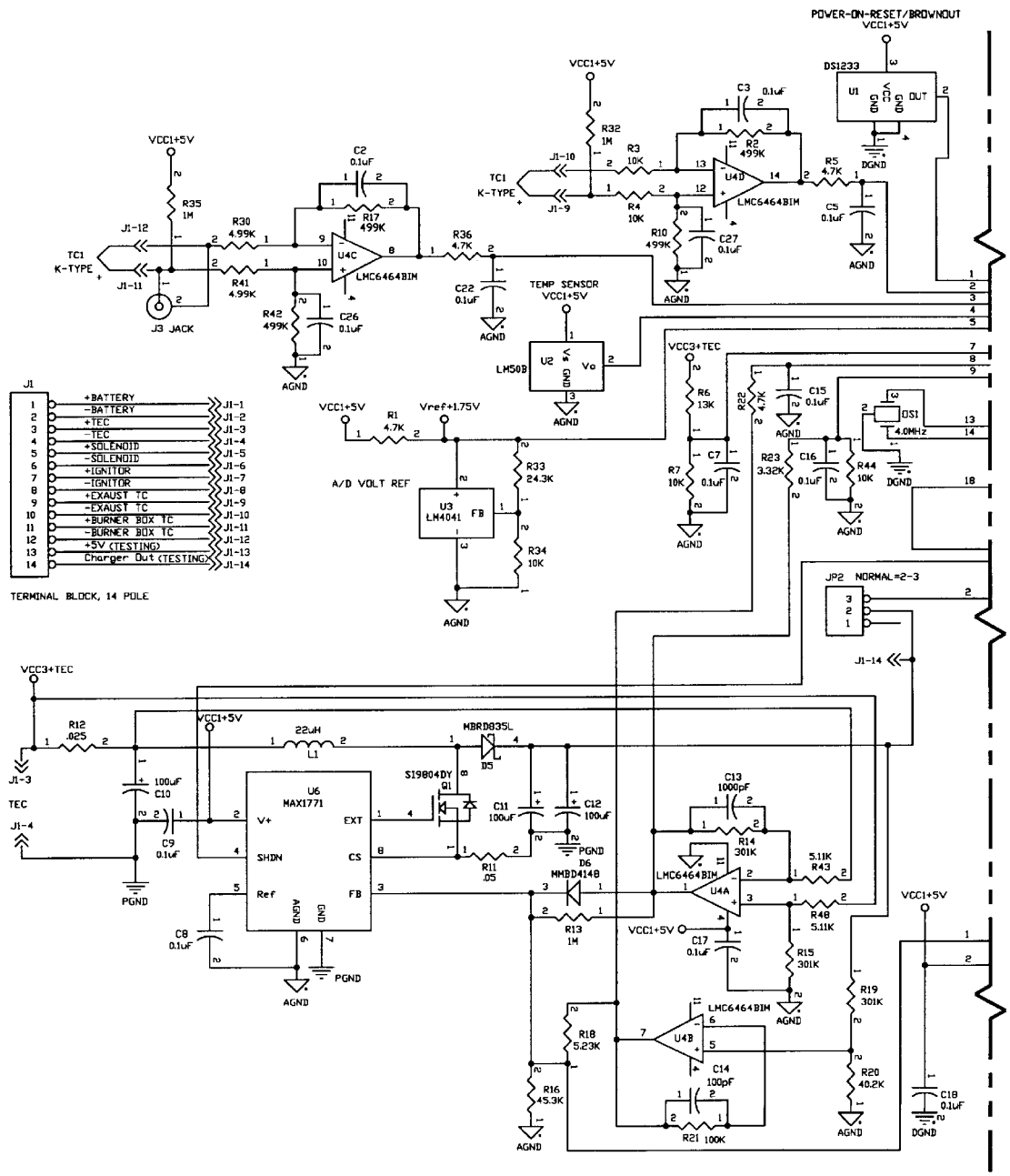
FIG. 4A is a first portion of a circuit schematic diagram illustrating the electrical interconnection of devices in one embodiment of the present invention.
Figure 4B:
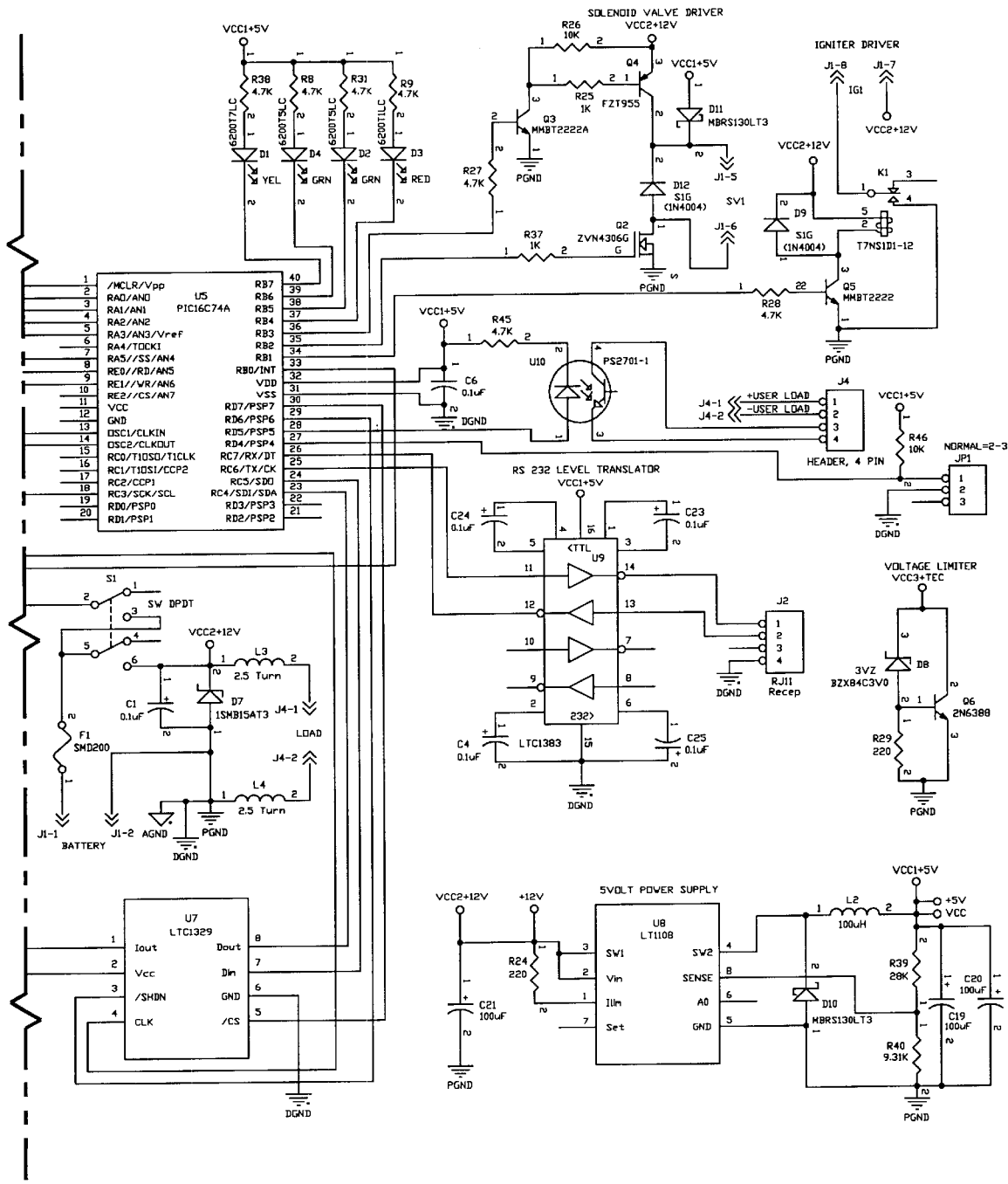
FIG. 4B is a second portion of a circuit schematic diagram illustrating the electrical interconnection of devices in one embodiment of the present invention.

Turning now to FIG. 4, there is shown a schematic circuit diagram of a control circuit board in one exemplary embodiment of the subject automatic burner driven generator system 10—a circuit board on which a plurality of the subject system's units are implemented. As there shown, an input node receives the input signal from thermoelectric converter unit 200 and voltage limiter 510. Voltage limiter 510 limits the voltage of the signal at this node to a maximum electric potential of approximately 4 volts. Among other things, this insures that the thermoelectric converter unit 200 temperature remains at a safe level. The signal at an input node is passed through interface circuitry to a differential amplifier U4A which operates to yield a measure of the voltage across a current shunt resistor R12. The output signal of differential amplifier U4A passes to the feedback input of a DC-to-DC converter U6 of charging unit 400 which then outputs a temperature-compensated voltage signal to battery unit 300.

Device U4A serves as a feedback current limiter for controlling the output voltage of DC-to-DC converter U6. It limits the converter's input current from thermoelectric converter unit 200 to approximately 1.25 amps such that the output voltage of DC-to-DC converter U6 remains at acceptable levels, and thermoelectric converter unit 200 operates at optimal efficiency.

Contributing to the feedback input signal of DC-to-DC converter U6 is the output of a voltage divider circuit formed in part by resistors R19 and R20 and amplifier U4B. The output of device U4B sums with the current output of the controller's digital-to-analog converter (DAC) U7. Each of the various feedback inputs to DC-to-DC converter U6 contribute to the setting of the battery unit charging voltage.

System 10 in this embodiment employs a second DC-to-DC converter U8 which operates within power supply unit 600 to generate an approximately 5-volt ancillary power supply signal. This power supply signal supplies much of the onboard power needs including that of DC-to-DC converter U6 and microcontroller device U5, as well as that of the operational amplifier devices and other active components.

U4C represents an operational amplifier device for amplifying the signal received from burner box thermocouple device. U4C amplifies the thermoelectric device's output voltage and passes it to microcontroller device U5 of controller 500 for processing. Operational amplifier U4D similarly receives and amplifies the output signal voltage of exhaust thermocouple device before passing it to microcontroller device U5 for processing.

Device U3 represents a device for generating a voltage reference signal for microcontroller device U5. Microcontroller device U5 includes analog-to-digital converters (ADC) that require a stable reference voltage against which to compare various other voltages.

Device U2 represents an onboard temperature sensor for deriving a measure of ambient temperature. Preferably, device U2 includes solid state temperature sensing means whose output is utilized by microcontroller device U5 to formulate a temperature reference based on which the charging unit's DC to DC converter U6 is adjusted and the cold junction compensation for the burner and exhaust thermocouple circuits is carried out.

Devices D1, D2, D3, D4 represent LEDs respectively employed as various system status indicators. They represent, for instance, visual indicators corresponding to the system's operation, ignition, run, and fault conditions.

Devices Q2, Q3, and Q4 represent drivers for solenoid valve 107 of burner unit 100. Their switching is suitably controlled by microcontroller device U5 to selectively transition between and hold solenoid valve 107 in its open (or on) and closed (or off) configurations.

Q5 represents a driver which, responsive to suitable actuation by microcontroller device U5, energizes igniter 105 of burner unit 100. Igniter 105 is preferably a resistant hot surface igniter. Such an igniter is a high power device which typically draws, on average, approximately 2 amps of current; hence, it is energized for continuous durations of no more than approximately than 20 seconds.

U9 represents an RS232 driver device coupled to microcontroller device U5. RS232 driver device U9 allows a user to establish communications interface with microcontroller device U5 whereby he/she may read out one or more data streams containing various parametric information pertaining to system 10 and its operation.

U10 represents an optically isolated output device coupled to microcontroller device U5. Device U10 enables the generation of a fault output based on which a message may be generated on the user's instrumentation to alert him/her accordingly.

Battery unit 300 includes one or more rechargeable battery devices of any suitable type known in the art that may withstand the environmental and operational requirements of the particular application intended. In the embodiment shown, battery unit 300 includes at least one lead acid gel cell rechargeable battery device which delivers an approximate 13-volt output.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of system control or system data processing steps may be reversed or interposed, all without departing from the spirit or scope of the invention as defined in the appended Claims.

What is claimed is:

1. An automatic burner driven generator system for powering a load comprising:
    (a) a burner unit for generating thermal energy, said burner unit having an enabling portion;
    (b) a thermoelectric converter unit operatively coupled to said burner unit for transducing at least a portion of said thermal energy to a first electric power signal;
    (c) a rechargeable battery unit operable to generate an output power signal for powering the load;
    (d) a charging unit operably coupled to said thermoelectric converter unit and said rechargeable battery unit, said charging unit being operable to adaptively convert said first electric power signal to a second electric power signal for charging said rechargeable battery unit; and,
    (e) a controller for automatically controlling the actuation of said units in programmed manner, said controller including a microprocessor unit programmably configured to selectively actuate said units in accordance with a plurality of predetermined operational states.

2. The automatic burner driven generator system as recited in claim 1 wherein said charging unit includes a first DC-DC converter.

3. The automatic burner driven generator system as recited in claim 2 wherein said controller includes a current limiter coupled to said charging unit for maintaining said first electric power signal at a current level no greater than a predetermined maximum current value.

4. The automatic burner driven generator system as recited in claim 3 wherein said current limiter includes a current limiting amplifier coupled in feedback manner to said first DC-DC converter.

5. The automatic burner driven generator system as recited in claim 3 further comprising a voltage limiter coupled to said thermoelectric converter and charging units for maintaining said first electric power signal at a voltage potential no greater than a predetermined maximum potential.

6. The automatic burner driven generator system as recited in claim 1 wherein said charging unit is operable responsive to said controller to generate said second electric power signal in temperature compensated manner relative to an ambient temperature parameter.

7. The automatic burner driven generator system as recited in claim 2 further comprising a power supply unit operably coupled to said rechargeable battery unit, said power supply unit being operable to generate at least one ancillary power signal for powering at least a portion of said system, said ancillary power signal being less in electric potential than said output power signal.

8. The automatic burner driven generator system as recited in claim 7 wherein said power supply unit includes a second DC-DC converter for converting said portion of said output power signal to said ancillary power signal.

9. The automatic burner driven generator system as recited in claim 8 wherein said output and ancillary power signals are respectively characterized predetermined voltage levels of approximately 12 V and 5 V.

10. The automatic burner driven generator system as recited in claim 7 wherein said enabling portion of said burner unit includes a solenoid valve for selectively admitting the entry of a fuel from a fuel source into said burner unit and an igniter for igniting the admitted fuel, said solenoid valve being switchable between open and closed configurations.

11. The automatic burner driven generator system as recited in claim 10 wherein said rechargeable battery unit is operatively coupled to said burner unit for electrically powering said enabling portion thereof, said solenoid valve being operably powered for transitioning between said open and closed configurations thereof by at least a portion of said output power signal, said solenoid valve being operably powered for maintaining said open configuration thereof by said ancillary power signal.

12. The automatic burner driven generator system as recited in claim 1 further comprising a power switch unit coupled to said rechargeable battery and charging units switchable between system ON and OFF states responsive to user actuation thereof, whereby one-switch activation of said system is enabled.

13. The automatic burner driven generator system as recited in claim 1 wherein said predetermined operational states include: initial, startup, warmup, run, wait, shutdown, and test states, said controller in said initial state automatically actuating up to a predetermined maximum number of burner ignition attempts, consecutive attempts being separated by at least a predetermined time interval.

14. The automatic burner driven generator system as recited in claim 13 wherein said controller in said initial state automatically monitors an exhaust temperature of said burner for determining the success of said burner ignition attempt.

15. The automatic burner driven generator system as recited in claim 13 wherein said controller in said startup state automatically actuates said charging unit to generate said second electric power signal responsive to detection of a plurality of predetermined conditions, said predetermined conditions including: a predetermined minimum time delay elapsing subsequent to successful ignition of said burner unit, a burner box temperature exceeding a predetermined minimum level therefor, and said first electric power signal exceeding in electric potential a predetermined minimum level.

16. The automatic burner driven generator system as recited in claim 1 wherein said controller includes a microprocessor device having at least one RS 232 port for enabling digital communication access thereto.

17. The automatic burner driven generator system as recited in claim 1 wherein said battery unit includes at least one lead acid gel cell battery device.

18. An automatic burner driven generator system for electrically powering a load in highly efficient manner comprising:
(a) a burner unit for generating thermal energy, said burner unit having an enabling portion;
(b) a thermoelectric converter unit operatively coupled to said burner unit for transducing at least a portion of said thermal energy to a first electric power signal;
(c) a rechargeable battery unit operable to generate an output power signal for powering the load, said rechargeable battery unit being operatively coupled to said burner unit for electrically powering said enabling portion thereof;
(d) a charging unit operably coupled to said thermoelectric converter unit and said rechargeable battery unit, said charging unit being operable to adaptively convert said first electric power signal to a second electric power signal for charging said rechargeable battery unit;
(e) a power supply unit operably coupled to said rechargeable battery unit, said power supply unit being operable to generate at least one ancillary power signal for powering at least a portion of said system, said ancillary power signal being less in electric potential than said output power signal; and,
(f) a controller for automatically controlling the actuation of said units in programmed manner, said controller including a microprocessor unit programmably configured to selectively actuate said units in accordance with a plurality of predetermined operational states, said predetermined operational states including: initial, startup, warmup, run, wait, shutdown, and test states.

19. The automatic burner driven generator system as recited in claim 18 wherein said controller in said startup state automatically actuates said charging unit to generate said second electric power signal responsive to detection of a plurality of predetermined conditions, said predetermined conditions including: a predetermined minimum time delay elapsing subsequent to successful ignition of said burner unit, a burner box temperature exceeding a predetermined minimum level therefor, and said first electric power signal exceeding in electric potential a predetermined minimum level therefor.

20. The automatic burner driven generator system as recited in claim 19 wherein said controller in said initial state automatically actuating up to a predetermined maximum number of burner ignition attempts, consecutive attempts being separated by at least a predetermined time interval.

21. The automatic burner driven generator system as recited in claim 18 wherein said controller is characterized by a power consumption during steady state operation of no more than approximately 0.2 watts.

22. The automatic burner driven generator system as recited in claim 18 wherein said power supply unit provides a predetermined power on the order of approximately 5 watts during steady state operation.

23. The automatic burner driven generator system as recited in claim 22 wherein said controller is characterized by a power consumption during steady state operation of no more than approximately 0.2 watts.

24. An automatic burner driven generator system for electrically powering a load having a highly extended service life comprising:

(a) a burner unit for generating thermal energy, said burner unit including a fuel fired burner device and an enabling portion coupled thereto, said enabling portion having a solenoid valve for selectively admitting the entry of a fuel from a fuel source into said fuel fired burner device and an igniter for igniting the admitted fuel, said solenoid valve being switchable between open and closed configurations;

(b) a thermoelectric converter unit operatively coupled to said burner unit for transducing at least a portion of said thermal energy to a first electric power signal;

(c) a rechargeable battery unit operable to generate an output power signal for powering the load, said rechargeable battery unit being operatively coupled to said burner unit for electrically powering said enabling portion thereof;

(d) a charging unit operably coupled to said thermoelectric converter unit and said rechargeable battery unit, said charging unit being operable to adaptively convert said first electric power signal to a second electric power signal for charging said rechargeable battery unit; and, (e) a controller for automatically controlling the actuation of said units in programmed manner, said controller including a microprocessor unit programmably configured to selectively actuate said units in accordance with a plurality of predetermined operational states, said predetermined operational states including: initial, startup, warmup, run, wait, shutdown, and test states, said controller being operable to automatically actuate up to a predetermined maximum number of burner re-ignition attempts separated by at least a predetermined time interval therebetween responsive to an operational interruption of said burner unit, said controller being operable to automatically initiate a safe shutdown sequence responsive to the occurrence of at least one predetermined fault condition.

25. The automatic burner as recited in claim 24 wherein said fuel fired burner is selected from the group consisting of: a flameless catalytic natural gas burner, and a flameless catalytic propane burner.

26. The automatic burner as recited in claim 24 wherein said fuel fired burner is selected from the group consisting of: a flame natural gas burner, and a flame propane burner.

27. The automatic burner driven generator system as recited in claim 24 wherein said controller is automatically operable in accordance with Class I Division 2 requirements of the National Electric Code.

28. The automatic burner driven generator system as recited in claim 24 further comprising a substantially weather tight enclosure for housing said controller and said units.

* * * * *